United States Patent
Kasai

(10) Patent No.: US 10,192,721 B2
(45) Date of Patent: Jan. 29, 2019

(54) HIGH-FREQUENCY POWER SOURCE

(71) Applicant: DAIHEN Corporation, Osaka-shi, Osaka (JP)

(72) Inventor: Yoshinobu Kasai, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 15/534,678

(22) PCT Filed: Dec. 9, 2015

(86) PCT No.: PCT/JP2015/084502
§ 371 (c)(1),
(2) Date: Jun. 9, 2017

(87) PCT Pub. No.: WO2016/093269
PCT Pub. Date: Jun. 16, 2016

(65) Prior Publication Data
US 2017/0352523 A1 Dec. 7, 2017

(30) Foreign Application Priority Data
Dec. 12, 2014 (JP) .................. 2014-252377

(51) Int. Cl.
*H03F 3/217* (2006.01)
*H01J 37/32* (2006.01)
(Continued)

(52) U.S. Cl.
CPC .. *H01J 37/32155* (2013.01); *H01J 37/32174* (2013.01); *H02M 7/493* (2013.01);
(Continued)

(58) Field of Classification Search
CPC ..................................... H03F 3/217
(Continued)

(56) References Cited

U.S. PATENT DOCUMENTS

| 9,304,146 B2* | 4/2016 | Pai ................ G01Q 60/16 |
| 2013/0113653 A1* | 5/2013 | Kishigami ............ G01S 7/285 342/189 |

(Continued)

FOREIGN PATENT DOCUMENTS

| JP | 2013-135159 A | 7/2013 |
| JP | 2014-173534 A | 9/2014 |
| JP | 2014-204501 A | 10/2014 |

OTHER PUBLICATIONS

International Search Report issued in PCT/JP2015/084502, dated Feb. 16, 2016 (1 page).
(Continued)

*Primary Examiner* — Henry Choe
(74) *Attorney, Agent, or Firm* — Hamre, Schumann, Mueller & Larson, P.C.

(57) ABSTRACT

[OBJECT] To provide a radio-frequency power source capable of outputting radio-frequency power having a desired waveform changing at high speed.
[SOLUTION] A radio-frequency power source 1 includes two DC-RF converting circuits 4A, 4B and an RF combining circuit 5 for combining the outputs from both DC-RF converting circuits 4A, 4B. The DC-RF converting circuits 4A, 4B amplify radio-frequency voltages $v_a$, $v_b$ inputted from a radio-frequency signal generating circuit 8, and output radio-frequency voltages $v_{PA}$, $v_{PB}$. The RF combining circuit 5 outputs radio-frequency voltage $v_{PX}$ at a ratio corresponding to the phase difference θ between the radio-frequency voltages $v_{PA}$ and $v_{PB}$. A controlling circuit 9 switches the phase difference θ between θ1 and θ2. As a result, the power $P_X$ outputted from the RF combining circuit 5 becomes pulsed radio-frequency power having a high level period and a low level period. Since the switching of the phase difference θ can be performed at high speed, it is
(Continued)

possible to output pulsed radio-frequency power with a high switching frequency between the first level and the second level.

14 Claims, 10 Drawing Sheets

(51) Int. Cl.
    *H05H 1/46*     (2006.01)
    *H02M 7/493*     (2007.01)
    *H02M 1/08*     (2006.01)
    *H02M 3/337*     (2006.01)
    *H02M 7/497*     (2007.01)
    *H02M 7/538*     (2007.01)
    *H02M 7/48*     (2007.01)

(52) U.S. Cl.
    CPC ............. *H03F 3/2173* (2013.01); *H05H 1/46* (2013.01); *H02M 1/08* (2013.01); *H02M 3/337* (2013.01); *H02M 7/497* (2013.01); *H02M 7/538* (2013.01); *H02M 2007/4815* (2013.01); *H03F 3/217* (2013.01); *H05H 2001/4682* (2013.01)

(58) Field of Classification Search
    USPC ...................................... 330/251, 124 R, 295
    See application file for complete search history.

(56) References Cited

U.S. PATENT DOCUMENTS

2014/0055034 A1*   2/2014   Coumou  .......... H01J 37/32082
                                                                        315/111.21
2014/0361690 A1   12/2014   Yamada et al.

OTHER PUBLICATIONS

Japanese Appeal Decision issued in corresponding Japanese Patent application No. 2016-563710, Sep. 5, 2018, and English machine translation (43 pages).

* cited by examiner

FIG.9
(a) Phase Difference θ
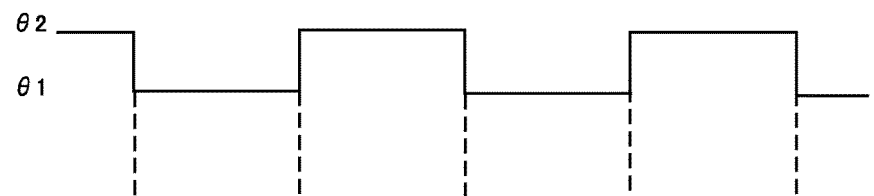
(b) RF Voltage $V_{PX}$
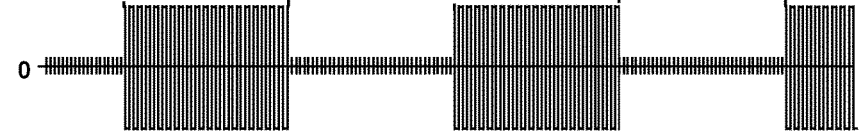

FIG.16
(a) 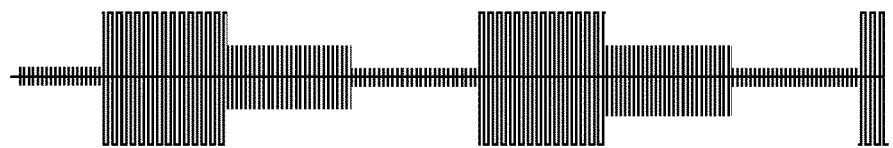
(b) 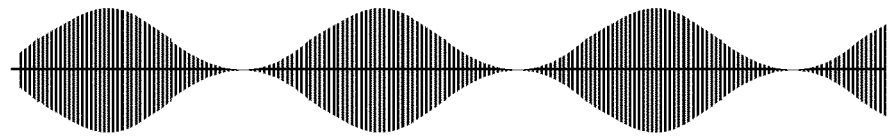
(c) 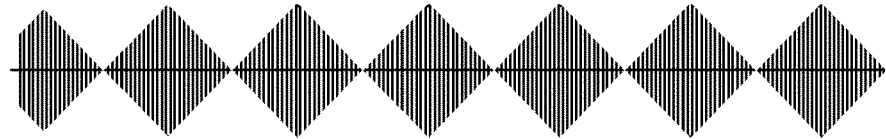
(d) 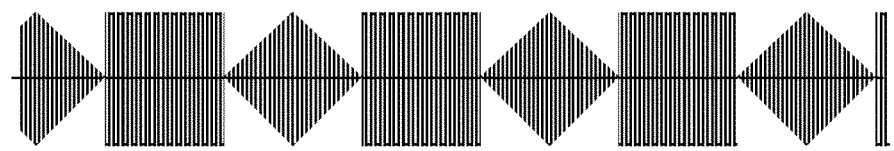
(e) 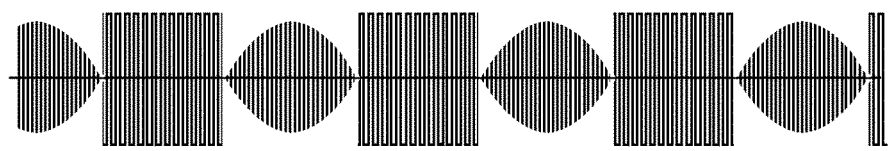
(f) 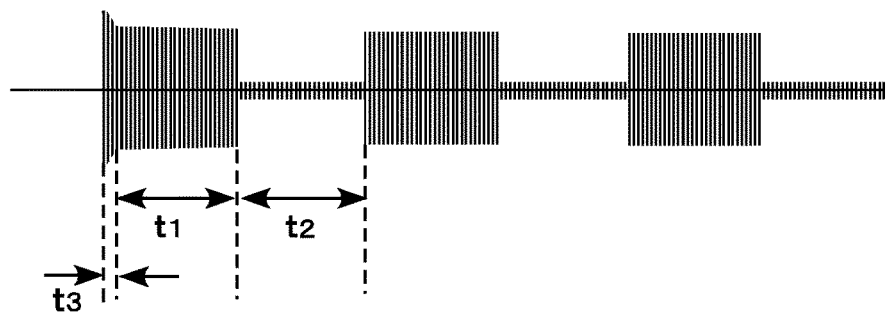

HIGH-FREQUENCY POWER SOURCE

TECHNICAL FIELD

The present invention relates to a radio-frequency power source used in a plasma processing system, for example.

BACKGROUND ART

The plasma processing system may be used in the following way. A fluorine-based gas and a workpiece, such as semiconductor wafers or liquid crystal substrates, are placed in the chamber of a plasma processing apparatus. In the chamber a pair of electrodes are provided, and radio-frequency power from the radio-frequency power source is provided to the pair of electrodes for generating electric discharge. This discharge generates a plasma of the gas contained, and thin film forming or etching is performed on the workpiece.

Conventionally, as a radio-frequency power source used in a plasma processing system, the following type is known. A radio-frequency power source outputs radio-frequency power of a predetermined frequency, and the output power is pulse-modulated based on pulse modulation control signals having a low frequency than that of the output power. In such radio-frequency power source, the radio-frequency power is outputted only during the high level period of the pulse modulation control signals, and there is no output during the low level period of the signals. Accordingly, the resulting radio-frequency power has a pulsed form (see, for example, Patent Document 1).

In addition to the above-described ON/OFF control in which the output and non-output states of the radio-frequency power are switched, there is also known a control method in which the amplitude of the radio-frequency power is switched between two levels, i.e., a first level and a second level which is lower than the first level. In this case of two-level control, for example, the voltage supplied to the amplifier is subjected to the switching between the two levels, so that the power outputted from the amplifier has corresponding two levels switched to form a pulsed output.

PRIOR ART DOCUMENT

Patent Document

Patent Document 1: JP-A-2013-135159

SUMMARY OF THE INVENTION

Problems to be Solved by the Invention

It is difficult, however, to conduct high-speed switching of the voltage supplied to the amplifier, and hence to produce radio-frequency pulsed power corresponding to the desired high switching frequency (referred to as "pulse frequency" below) of the first and second levels. Likewise, due to the difficulty of high-speed changing of the voltage supplied to the amplifier, it is difficult to produce radio-frequency power having a desired waveform.

The present invention has been proposed under the above-noted circumstances, and an object of the invention is to provide a radio-frequency power source capable of outputting radio-frequency power of a desired fast-changing waveform.

Means to Solve the Problem

A radio-frequency power source includes; a radio-frequency generator that produces radio-frequency signals having a variable phase difference between them; a radio-frequency combiner that combines the radio-frequency signals outputted from the radio-frequency generator by a predetermined ratio depending on the phase difference, and that outputs to a load; an output controller that causes the radio-frequency generator to change the phase difference, thereby controlling radio-frequency power outputted the from radio-frequency combiner. The output controller performs control so that the phase difference changes so as to make the radio-frequency power outputted from the radio-frequency combiner into a desired waveform.

In a preferred embodiment of the invention, the output controller performs control so that the phase difference is switched between a first predetermined value and a second predetermined value.

In a preferred embodiment of the invention, the predetermined ratio is greater when the phase difference is equal to the first predetermined value than when the phase difference is equal to the second predetermined value.

In a preferred embodiment of the invention, the first predetermined value is equal to or greater than 0 [deg] and smaller than 90 [deg], and the second predetermined value is equal to or greater than 90 [deg] and equal to or smaller than 180 [deg].

In a preferred embodiment of the invention, the first predetermined value is equal to 0 [deg].

In a preferred embodiment of the invention, the second predetermined value is equal to 180 [deg].

In a preferred embodiment of the invention, the output controller performs feedback control with respect to the radio-frequency power by changing one of the first predetermined value or the second predetermined value.

In a preferred embodiment of the invention, the radio-frequency generator generates a first radio-frequency signal and a second radio-frequency signal, and the output controller switches a phase difference of the second radio-frequency signal relative to the first radio-frequency signal between the first predetermined value and the second predetermined value.

In a preferred embodiment of the invention, the output controller switches the phase difference among a first predetermined value, a second predetermined value and a third predetermined value.

In a preferred embodiment of the invention, the output controller changes the phase difference in accordance with a linear function.

In a preferred embodiment of the invention, wherein the output controller changes the phase difference in accordance with the following formula, where θ is the predetermined phase difference, and x(t) is a function corresponding to a desired waveform:

$$\theta = 2 \cdot \cos^{-1}(\sqrt{x(t)}).$$

In a preferred embodiment of the invention, the output controller switches the phase difference between a first predetermined value and a value of a predetermined function.

In a preferred embodiment of the invention, the output controller sets the phase difference to a predetermined phase difference at a time when power output to the load starts, where the power output becomes greater when the predetermined phase difference is set than when each of the first predetermined value and the second predetermined value is set.

In a preferred embodiment of the invention, the output controller does not set the predetermined ratio to zero.

In a preferred embodiment of the invention, the radio-frequency combiner is constituted by hybrid circuitry including a transmission transformer and a power-consuming resistor. When there is a phase difference between the plurality of radio-frequency signals, the resistor thermally consumes power corresponding to the phase difference, and the remaining power is outputted from the radio-frequency combiner.

Effect of the Invention

According to the present invention, by adjusting the phase difference, it is possible to change the waveform of radio-frequency power combined by and outputted from the radio-frequency combiner. Since the phase difference between the radio-frequency signals generated by the radio-frequency generator can be changed at high speed, it is possible to output radio-frequency power having a desired waveform changing at high speed.

BRIEF DESCRIPTION OF THE DRAWINGS

FIG. 9 shows the waveform of the radio-frequency voltage $v_{PX}$ outputted from the RF combining circuit.

FIG. 16 shows the waveform of the radio-frequency voltage $v_{PX}$ outputted from the RF combining circuit.

MODE FOR CARRYING OUT THE INVENTION

Preferred embodiments of the present invention will be described below with reference to the accompanying drawings. In particular, as an example, a radio-frequency or RF power source applied to a plasma processing system is described.

Figure 1:
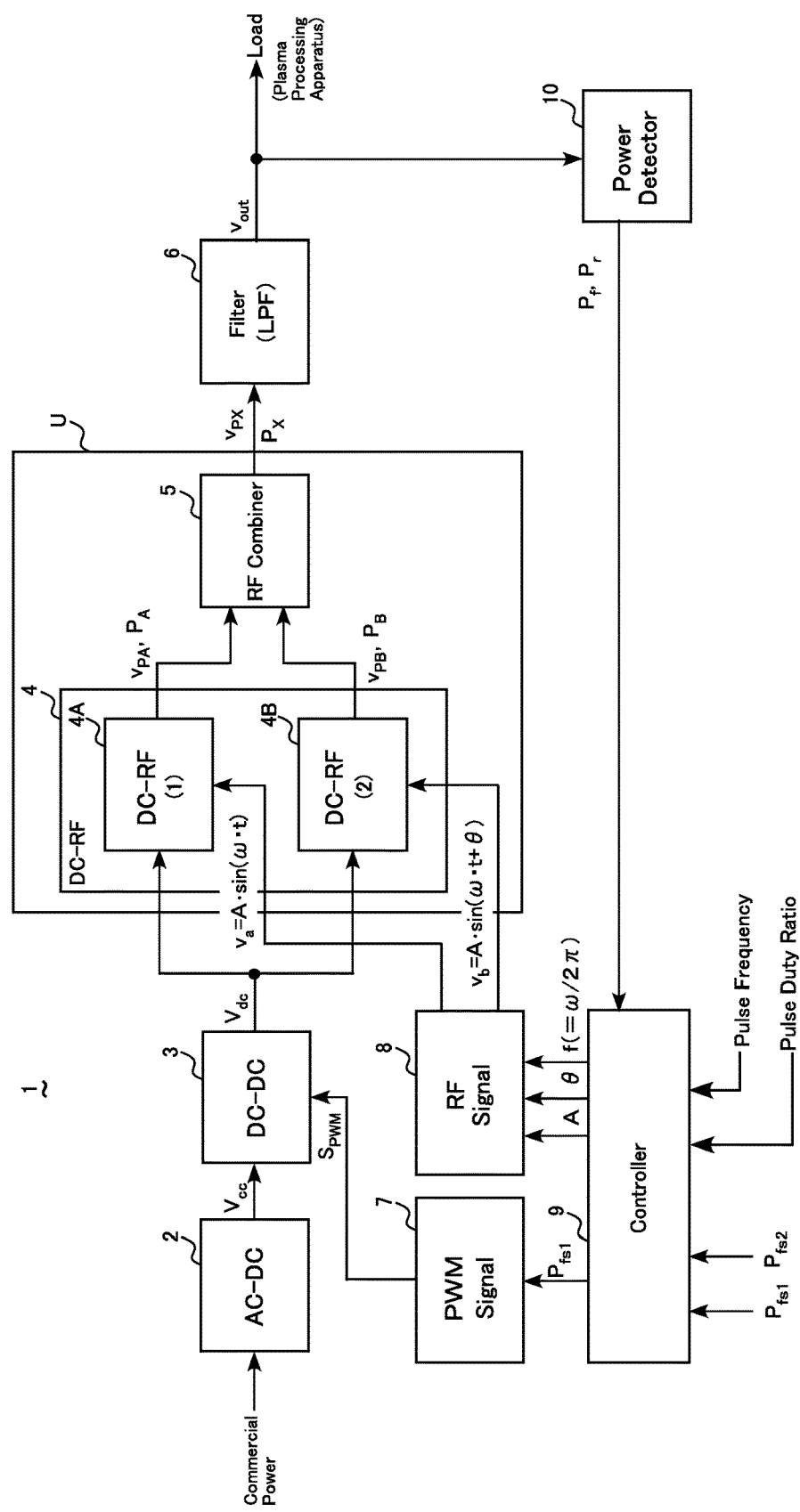
FIG. 1 is a block diagram showing the internal configuration of a radio-frequency power source of the present invention.

FIG. 1 is a block diagram showing the internal configuration of a radio-frequency power source according to the present invention.

The radio-frequency power source 1 shown in FIG. 1 is configured to output pulsed radio-frequency power having a high level period in which the amplitude becomes a first level and a low level period in which the amplitude becomes a second level which is lower than the first level. The radio-frequency power source 1 includes two power amplifiers and a power combiner or combining circuit to combine the output powers from the two power amplifiers. The power combiner can change the combining ratio in accordance with the phase difference θ between the two input voltage signals, where the ratio is variable from a state in which all the inputted power is outputted to a state in which all the inputted power is thermally consumed, thereby resulting in zero output. The illustrated radio-frequency power source 1 is so configured that the phase difference θ of the two radio-frequency voltages $v_a$, $v_b$ inputted to the two power amplifiers is switched between two values (i.e., the first phase difference θ1 and the second phase difference θ2 (>θ1)), whereby desired pulsed radio-frequency power is outputted from the power combining circuit. Specifically, by setting the phase difference θ to the first phase difference θ1 for a certain period of time, the output from the power combining circuit becomes the first level of power ("high level period"). Further, by setting the phase difference θ to the second phase difference θ2 for the subsequent, certain period of time, the output from the power combining circuit becomes the second level of power ("low level period"). By repeating this, desired pulsed radio-frequency power is to be outputted.

The radio-frequency power source 1 includes an AC-DC converting circuit 2, a DC-DC converting circuit 3, a DC-RF converting circuit 4, an RF combining circuit 5, a filtering circuit 6, a power detecting circuit 10, a PWM signal generating circuit 7, a radio-frequency signal generating circuit 8, and a control circuit 9. A portion including the DC-RF converting circuit 4 and the RF combining circuit 5 constitutes radio-frequency generating circuitry U to output radio-frequency power to the load. The DC-RF converting circuit 4 includes two DC-RF converting circuits 4A, 4B of the same configuration. The power $P_A$ outputted from the first DC-RF converting circuit 4A and the power $P_B$ outputted from the second DC-RF converting circuit 4B are combined or synthesized by the RF combining circuit 5. The combined power is outputted to the load (a plasma processing apparatus, not shown) connected to an output terminal of the radio-frequency power source 1.

The AC-DC converting circuit 2 is a circuit block that generates an input voltage (DC voltage) $V_{cc}$ to the DC-DC converting circuit 3 based on commercial power source. The AC-DC converting circuit 2 can be constituted by a well-known circuit. For example, the AC-DC converting circuit 2 may include a rectifying circuit in which four semiconductor rectifying elements are bridge-connected. The voltage inputted from the commercial power source is rectified by the rectifying circuit and smoothed by a smoothing circuit to produce DC voltage $V_{cc}$.

The DC-DC converting circuit 3 converts the DC voltage $V_{cc}$ inputted from the AC-DC converting circuit 2 into a DC voltage $V_{dc}$ of a desired voltage value and outputs the converted DC voltage to the DC-RF converting circuit 4.

Figure 2:
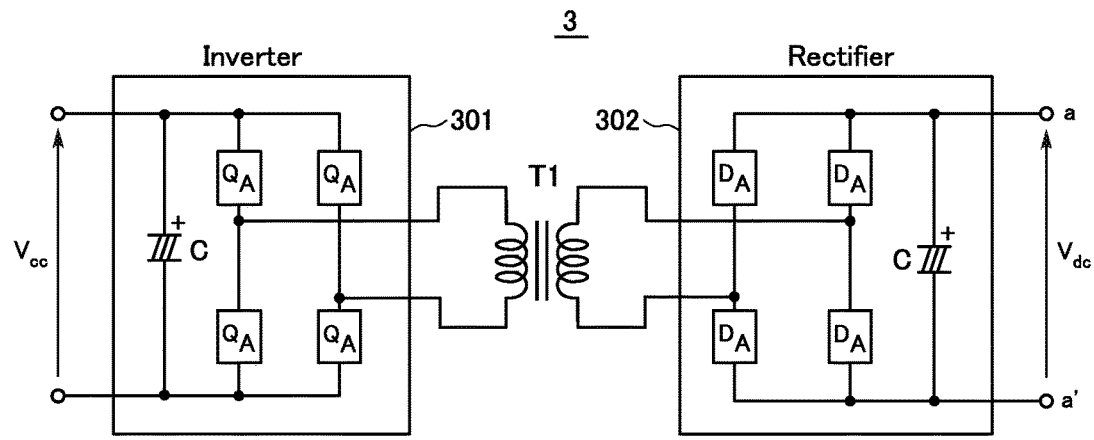
FIG. 2 shows an example of circuit of a DC-DC converter constituting a DC-DC converting circuit.

The DC-DC converting circuit 3 can be constituted by a well-known DC-DC converter shown in FIG. 2 in which a rectifying circuit is combined with an inverter. The circuit example of FIG. 2 includes an inverter 301 formed of a bridge circuit in which four semiconductor switch elements $Q_A$ are bridge-connected, and a rectifying circuit 302 connected to the inverter 301 via a transformer T1. The rectifying circuit 302 includes four semiconductor rectifying elements DA bridge-connected and a smoothing capacitor C connected in parallel to a pair of output terminals. The two output terminals of the rectifying circuit 302 are respectively connected to two output ends a, a' of the DC-DC converting circuit 3. As the semiconductor switch elements $Q_A$, use is made of a bipolar transistor, a field effect transistor, an IGBT, or the like. As the semiconductor rectifying element $D_A$, use is made of a diode.

The DC-DC converting circuit 3 switches the four semiconductor switching elements $Q_A$ of the inverter 301 between ON state and OFF state, based on the PWM signal $S_{PWM}$ inputted from the PWM signal generating circuit 7. A DC voltage $V_{dc}$ corresponding to the duty ratio ("PWM duty ratio") of the PWM signal SPWM is outputted from the DC-DC converting circuit 3. The larger the PWM duty ratio is, the larger the DC voltage $V_{dc}$ becomes.

The DC-RF converting circuit 4 converts DC power input from the DC-DC converting circuit 3 into predetermined radio-frequency power. The output frequency of the radio-frequency power is chosen for plasma processing, such as 2.0 MHz or 13.56 MHz. In the DC-RF converting circuit 4, two DC-RF converting circuits 4A, 4B of the same configuration are provided.

Figure 3:
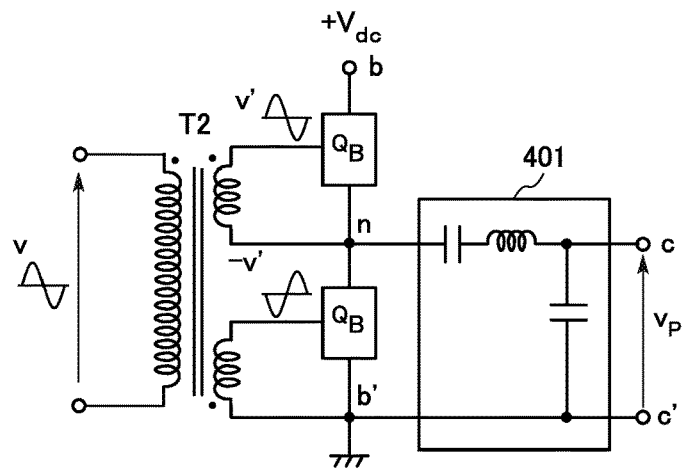
FIG. 3 shows an example of a DC-RF converting circuit.

The first and second DC-RF converting circuits 4A, 4B are configured by half-bridge type, class-D amplifiers shown in FIG. 3. The class-D amplifier of the figure has two identical type of semiconductor switching elements $Q_B$ connected in series between a pair of power supply terminals b and b'. An output circuit 401 is connected between the connection point n of the two semiconductor switch elements $Q_B$ and the output terminal c. The output circuit 401 is a filtering circuit including a direct-current cutting capacitor and an L-shaped circuit of a capacitor and a reactor. The transformer T2 constitutes a drive circuit for driving the two semiconductor switch elements $Q_B$. In the transformer T2, radio-frequency voltage v is inputted to the primary winding, and radio-frequency voltage v' having the same phase as the radio-frequency voltage v is outputted from a first secondary winding (the upper secondary winding in FIG. 3). Further, from the other secondary winding (the lower secondary winding in FIG. 3) is outputted radio-frequency voltage −v' opposite in phase to the radio-frequency voltage v. The radio-frequency voltage v' is inputted to the first semiconductor switch element $Q_B$ (the upper semiconductor switch element $Q_B$ in FIG. 3), and the radio-frequency voltage −v' is inputted to the second semiconductor switch element $Q_B$ (the lower semiconductor switch element $Q_B$ in FIG. 3). The radio-frequency voltage v to be inputted to the primary winding of the transformer T2 is a sine wave voltage having an output frequency f for plasma processing, such as 2.0 MHz or 13.56 MHz.

The power supply terminals b and b' of the first DC-RF converting circuit 4A are connected to the two terminals b and b' of the second DC-RF converting circuit 4B, respectively. A DC voltage $V_{dc}$ outputted from the output terminals a, a' of the DC-DC converting circuit 3 is supplied between the power supply terminals b and b'. As the semiconductor switch element $Q_B$, use may be made of an N-channel type MOSFET, but another type of transistor such as a bipolar transistor or the like can also be used. Alternatively, the paired semiconductor switch elements $Q_B$ may be constituted as a complementary type, including one N-channel type and one P-channel type. In this case, use may be made of only a single secondary winding in the transformer T2, where the radio-frequency voltage v' is inputted to the gates of the respective N channel type and P channel type MOSFETs.

In the first and second DC-RF converting circuits 4A and 4B, radio-frequency voltage $v_a$ or $v_b$ (subscripts "a" and "b" correspond to the first DC-RF converting circuit 4A and the second DC-RF converting circuit 4B, respectively) to be inputted to the primary winding of the corresponding transformer T2 is generated by the radio-frequency signal generating circuit 8. Specifically, the radio-frequency signal generating circuit 8 generates radio-frequency voltages represented by $v_a = A \cdot \sin(\omega \cdot t + \varphi_a)$ and $v_b = A \cdot \sin(\omega \cdot t + \varphi_b)$. Here, the angular frequency $\omega$ is equal to $2\pi f$, and herein, the angular frequency $\omega$ may be used instead of the output frequency f. The initial phase $\varphi_a$ of the radio-frequency voltage $v_a$ is fixed to 0 [deg], while the initial phase $\varphi_b$ of the radio-frequency voltage $v_b$ is variable. The radio-frequency signal generating circuit 8 will change the initial phase $\varphi_b$ (=θ) of the radio-frequency voltage $v_b$ based on the phase difference $\theta = \varphi_b - \varphi_a$ inputted from the controlling circuit 9. The details of the manner to change the phase difference 9 will be described later. Alternatively, the initial phase $\varphi_a$ may be varied while the initial phase $\varphi_b$ may be fixed to 0 [deg], or both of the initial phases $\varphi_a$, $\varphi_b$ may be varied. For example, the initial phase $\varphi_a$ may be varied in a range of 0 [deg] to −90 [deg], while the initial phase $\varphi_b$ may be varied in a range of 0 [deg] to 90 [deg]. In this case, the phase difference θ=90 [deg] may correspond to a combination of $\varphi_a = -45$ [deg] and $\varphi_b = 45$ [deg].

In the first DC-RF converting circuit 4A, when the radio-frequency voltage $v_a = A \cdot \sin(\omega \cdot t)$ is inputted to the primary winding of the transformer T2, radio-frequency voltage $v_a'$ of the same phase, $A' \cdot \sin(\omega \cdot t)$, is outputted from one of the secondary windings of the transformer T2. In addition, radio-frequency voltage $-v_a'$ of the reverse phase, $-A' \cdot \sin(\omega \cdot t)$, is outputted from the other secondary winding of the transformer T2. The in-phase radio-frequency voltage $v_a'$ is inputted to one of the semiconductor switch elements $Q_B$ (the upper semiconductor switch element $Q_B$ in FIG. 3), and the reversed-phase radio-frequency voltage $-v_a'$ is inputted to the other semiconductor switch element $Q_B$ (the lower side semiconductor switching element $Q_B$ in FIG. 3). In the case where the two semiconductor switch elements $Q_B$ are N-channel MOSFETs, one semiconductor switch element $Q_B$ is turned on during a high level period of the radio-frequency voltage $v_a'$, and the other semiconductor switch element $Q_B$ is turned on during a high level period of the radio-frequency voltage $-v_a'$. In this manner, the two semiconductor switch elements $Q_B$ alternately and repeatedly are turned on or off for every half cycle of the radio-frequency voltage $v_a'$.

Since the two semiconductor switching elements $Q_B$ are alternately and repeatedly turned on and off, as noted above, the voltage $v_n$ at the connection point n becomes "$V_{dc}$" in the period of $v_a' > 0$, and becomes the ground level in the period of $v_a' \le 0$, and thus the changing of the voltage produces a rectangular waveform. The direct current component of the rectangular wave and the switching noise are removed by the output circuit 401, and a radio-frequency voltage $v_{PA} = V \cdot \sin(\omega \cdot t)$, or amplified radio-frequency voltage $v_a$, is outputted from the output terminals c and c'.

The second DC-RF converting circuit 4B is configured to operate in the same manner as the above-described first DC-RF converting circuit 4A, to output radio-frequency voltage $v_{PB}$, or $V \cdot \sin(\omega \cdot t + \theta)$, corresponding to amplified radio-frequency voltage $v_b$.

In the above embodiment, the first and second DC-RF converters 4A, 4B are provided by half-bridge-type amplifiers, but they may also be full-bridge-type or push-pull-type amplifiers. Further, the present disclosure is not limited to a switching amplifier, and use may be made of a linear amplifier.

The RF combining circuit 5 combines two radio-frequency powers $P_A$, $P_B$ outputted from the DC-RF converting circuit 4. The RF combining circuit 5 is constituted by, for example, a hybrid circuit including a transmission transformer T3 and a resistor R shown in FIG. 4. The hybrid circuit has one sum port $N_S$ and two input ports $N_A$, $N_B$. When there is a phase difference between the AC voltage inputted to the input port $N_A$ and the AC voltage inputted to the input port $N_B$, part of the input power corresponding to the phase difference is thermally consumed by the resistor R and the remaining power is outputted.

Figure 4:
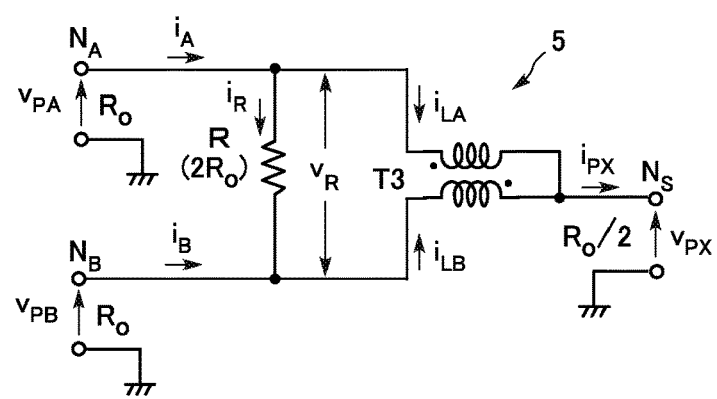
FIG. 4 shows an example of hybrid circuitry constituting an RF combining circuit.

As shown in FIG. 4, the radio-frequency voltage $v_{PA}$ outputted from the first DC-RF converting circuit 4A is inputted to one input port $N_A$, and the radio-frequency voltage $v_{PB}$ outputted from the second DC-RF converting circuit 4B is inputted to the other input port $N_B$. As a result, radio-frequency voltage $v_{PX}$ is outputted from the sum port $N_S$.

When the load connected to the sum port $N_S$ has an impedance of $R_o/2$ (i.e., when the RF combining circuit 5 and the load are impedance-matched), the radio-frequency current $i_{PX}$ and the radio-frequency voltage $v_{PX}$ to be outputted from the sum port $N_S$ are as follows, where the radio-frequency voltages $v_{PA}$ and $v_{PB}$ are $V \cdot \sin(\omega \cdot t)$ and $V \cdot \sin(\omega \cdot t + \theta)$, respectively.

The voltage $v_R$ across the resistor R is as follows.

$$v_R = v_{PA} - v_{PB} = V \cdot [\sin(\omega \cdot t) - \sin(\omega \cdot t + \theta)] \tag{1}$$

The currents $i_A$, $i_B$ inputted to the transmission transformer T3 from the input ports $N_A$, $N_B$ and the current $i_R$ flowing through the resistor R are as follows.

$$i_A = V_{PA}/R_o = V \cdot \sin(\omega \cdot t)/R_o \tag{2}$$

$$i_B = V_{PB}/R_o = V \cdot \sin(\omega \cdot t + \theta)/R_o \tag{3}$$

$$i_R = V_R/(2 \cdot R_o) \tag{4}$$
$$= V \cdot [\sin(\omega \cdot t) - \sin(\omega \cdot t + \theta)]/(2_o \cdot R_o)$$

Thus, the $i_{LA}$, $i_{LB}$ flowing through the primary winding and the secondary winding of the transmission transformer T3 are as follows.

$$i_{LA} = i_A - i_R = V \cdot [\sin(\omega \cdot t) + \sin(\omega \cdot t + \theta)]/(2_o \cdot R_o) \tag{5}$$

$$i_{LB} = i_B + i_R = V \cdot [\sin(\omega \cdot t) + \sin(\omega \cdot t + \theta)]/(2_o \cdot R_o) \tag{6}$$

and, the radio-frequency current $i_{PX}$ and radio-frequency voltage $v_{PX}$ to be outputted from the sum port $N_S$ are as follows.

$$i_{PX} = i_{LA} + i_{LB} = V \cdot [\sin(\omega \cdot t) + \sin(\omega \cdot t + \theta)]/R_o \tag{7}$$

$$V_{PX} = i_{PX} \cdot (R_o/2) \tag{8}$$
$$= V \cdot [\sin(\omega \cdot t) + \sin(\omega \cdot t + \theta)]/2$$
$$= V \cdot [\sin\{(\omega \cdot t + \theta/2) - \theta/2\} + \sin\{(\omega \cdot t + \theta/2) + \theta/2\}]/2$$
$$= V \cdot [\sin(\omega \cdot t + \theta/2) \cdot \cos(\theta/2) - \cos(\omega \cdot t + \theta/2) \cdot \sin(\theta/2) +$$
$$\sin(\omega \cdot t + \theta/2) \cdot \cos(\theta/2) + \cos(\omega \cdot t + \theta/2) \cdot \sin(\theta/2)]/2$$
$$= V \cdot \cos(\theta/2) \cdot \sin(\omega \cdot t + \theta/2)$$

The power $P_X$ outputted from the output port $N_S$ and the power $P_R$ consumed by the resistor R are as follows.

$$PX = V_{PX}^2/(R_o/2) = 2 \cdot V_{PX}^2/R_o \tag{9}$$
$$= V^2 \cdot [\sin(\omega \cdot t) + \sin(\omega \cdot t + \theta)]^2/(2_o \cdot R_o)$$
$$= 2 \cdot [V \cdot \cos(\theta/2)]^2 \cdot \sin^2(\omega \cdot t + \theta/2)/R_o$$

$$P_R = V_R^2 \cdot (2_o/R_o) \tag{10}$$
$$= V^2 \cdot [\sin(\omega \cdot t) - \sin(\omega \cdot t + \theta)]^2(2_o \cdot R_o)$$
$$= V^2 \cdot [\sin\{(\omega \cdot t + \theta/2) - \theta/2\} - \sin\{(\omega \cdot t + \theta/2) + \theta/2\}]^2/(2_o \cdot R_o)$$
$$= V^2 \cdot [\sin(\omega \cdot t + \theta/2) \cdot \cos(\theta/2) - \cos(\omega \cdot t + \theta/2) \cdot \sin(\theta/2) -$$
$$\sin(\omega \cdot t + \theta/2) \cdot \cos(\theta/2) - \cos(\omega \cdot t + \theta/2) \cdot \sin(\theta/2)]^2/(2_o \cdot R_o)$$
$$= V^2 \cdot [-2\cos(\omega \cdot t + \theta/2) \cdot \sin(\theta/2)]^2/(2_o \cdot R_o)$$
$$= 2 \cdot [V \cdot \sin(\theta/2)]^2 \cdot \cos^2(\omega \cdot t + \theta/2)/R_o$$

The powers $P_A$, $P_B$ inputted from the input ports $N_A$, $N_B$ are $P_A = V^2 \sin^2(\omega \cdot t)/R_o$ and $P_B = V^2 \sin^2(\omega \cdot t + \theta)/R_o$. Thus, the power $P_{in}$ inputted to the RF combining circuit 5 is $$P_{in} = P_A + P_B = V^2 \cdot [\sin^2(\omega \cdot t) + \sin^2(\omega \cdot t + \theta)]/R_o$$

On the other hand, the total power $P_{sum}$ obtained from the addition of the power $P_X$ outputted from the RF combining circuit 5 and the power $P_R$ thermally consumed by the resistor R is $$P_{sum} = P_X \times P_R$$
$$= V^2 \cdot [\sin(\omega \cdot t) + \sin(\omega \cdot t + \theta)]^2/(2_o \cdot R_o) + V^2 \cdot [\sin(\omega \cdot t) -$$
$$\sin(\omega \cdot t + \theta)]^2/(2_o \cdot R_o)$$
$$= V^2 \cdot [2\sin^2(\omega \cdot t) + 2\sin^2(\omega \cdot t + \theta)/(2_o \cdot R_o)$$
$$= V^2 \cdot [\sin^2(\omega \cdot t) + \sin^2(\omega \cdot t + \theta)]/R_o$$

Hence, $P_{in} = P_{sum}$.

Accordingly, when $\theta = 0$ [deg], then $P_R = 0$ and the input power $P_{in}$ itself is outputted, as output power $P_X$, from the RF combining circuit 5. When $\theta = 180$ [deg], then $PX = 0$ and the output from the RF combining circuit 5 is zero. When 0 [deg] $< \theta <$ 180 [deg], the resultant power obtained by combining the input powers $P_A$ and $P_B$ by a predetermined ratio $\eta(\theta)$ depending on the phase difference $\theta$ is outputted as the output power $P_X$ from the RF combining circuit 5.

Figure 5:
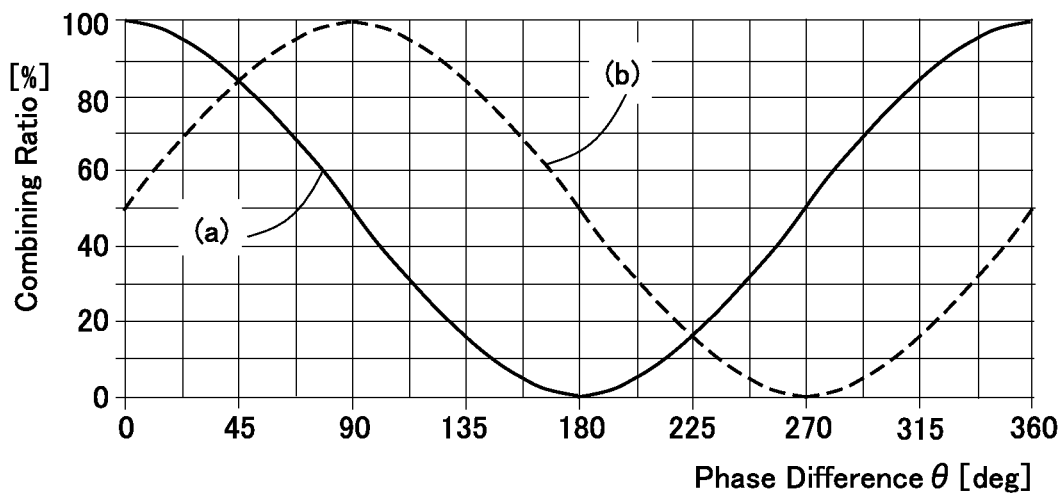
FIG. 5 shows the relationship between the power combining ratio of the RF combining circuit and the phase difference.

The above ratio $\eta(\theta)$ is equal to $\cos^2(\theta/2)$, as shown in equation (9), and its graph is depicted in FIG. 5, indicated by (a). The power combining ratio $\eta(\theta)$ is 100% when the phase difference $\theta$ is 0 [deg]. As the phase difference $\theta$ increases, $\cos^2(\theta/2)$ monotonously decreases, and when the phase difference $\theta$ is 180 [deg], it becomes 0%. In the present embodiment, the phase difference $\theta$ is switched between a first phase difference $\theta 1$ (e.g., 20 [deg]) and a second phase difference $\theta 2$ (e.g., 160 [deg]). By switching between the larger combining ratio $\eta(\theta 1)$ and the smaller combining ratio $\eta(\theta2)$, the output power $P_X$ will become pulsed radio-frequency power. The reason why the first phase difference $\theta1$ is set to 20 [deg] and the second phase difference $\theta2$ is set to 160 [deg] is as follows. The output power control is performed, as described below, by varying the first and second phase differences $\theta1$, $\theta2$. Thus, to allow desired variation, a certain range allowing for the variation is given to the first and second phase differences $\theta1$, $\theta2$. Without any limitation, it may be arranged that the value of the first phase difference $\theta1$ is selected from a range of 0 [deg] to 90 [deg], while the value of the second phase difference $\theta2$ is selected from a range of 90 [deg] to 180 [deg].

In the present embodiment, the first and second phase differences $\theta1$, $\theta2$ are set within a range of 0 [deg] to 180 [deg]. Alternatively, each phase difference may be set, for example, within a range of 180 [deg] to 360 [deg], or within a range of 0 [deg] to −180 [deg].

FIG. 5(a) corresponds to the case where the impedance of the load connected to the sum port $N_S$ is $R_o/2$. When the given impedance is other than $R_o/2$, the changing of the phase difference $\theta$ in a range of 0 [deg] to 180 [deg] enables controlling the magnitude of the power $P_X$ to be outputted from the RF combining circuit 5.

Figure 6:
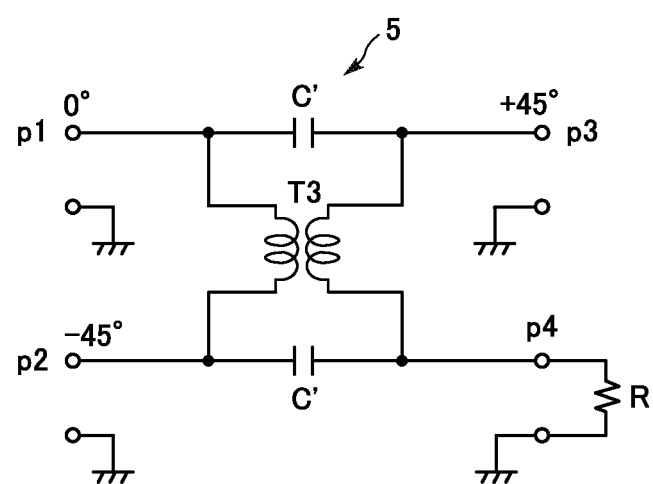
FIG. 6 shows an example of an RF combining circuit.

The configuration of the hybrid circuit used for the RF combining circuit 5 is not limited to that shown in FIG. 4. For example, use may be made of a hybrid circuit having a configuration as shown in FIG. 6 for the RF combining circuit 5. In the hybrid circuit of FIG. 6, each end of the primary winding of the transmission transformer T3 is connected to one end of the secondary winding via a capacitor C', and the four terminals, that is, both ends of the primary winding and both ends of the secondary winding are in unbalanced state. To be used as the RF combining circuit 5, one terminal p1 of the primary winding serves as an output terminal of combined power. The other terminal p2 of the primary winding and one terminal p3 of the secondary winding serve as input terminals, and the other terminal p4 of the secondary winding is connected to a resistor R for thermal consumption.

By the circuit configuration of FIG. 4, the power consumption $P_R$ of the resistor R is zero when the phase difference $\theta$ is 0 [deg]. In the circuit configuration of FIG. 6, on the other hand, the power consumption $P_R$ of the resistor R is zero when the phase difference $\theta$ is 90 [deg], and as the phase difference $\theta$ deviates from 90 [deg], power $P_R$ corresponding to the deviation is consumed at the resistance R. Specifically, by the circuit configuration of FIG. 6, the power combining ratio $\eta(\theta)$ advances by 90 [deg] relative to that of the circuit configuration of FIG. 4. Hence, as shown by FIG. 5(b), the characteristic denoted by $\cos^2(\theta/2+\pi/2)=\sin^2(\theta/2)$ is obtained. In this case, the first phase difference $\theta1$ and the second phase difference $\theta2$ may be set within a range of −90 [deg] to 90 [deg]. Alternatively, they may be set within a range of 90 [deg] to 270 [deg], for example.

The RF combining circuit 5 may be substituted by other circuitry as long as the same function as that of the above-described hybrid circuit is performed. For instance, use may be made of a radio-frequency power combiner disclosed in JP-A-2008-28923 or an output combining circuit disclosed in JP-U-H04-48715.

The filtering circuit 6 is, for example, a low-pass filter (LPF) provided by a n type circuit with two capacitors and one reactor. The filtering circuit 6 removes harmonics of the radio-frequency voltage $v_{PX}$ and radio-frequency current $i_{PX}$ outputted from the RF combining circuit 5, while also outputting the resultant fundamental wave component to the load. The filtering circuit 6 is not limited to the above-noted n-type circuit made up of capacitors and a reactor as long as it serves as a low-pass filter (LPF).

The power detecting circuit 10 may detect, without limitation, forward wave power $P_f$ outputted from the radio-frequency power source 1. The power detecting circuit 10 includes a directional coupler, from which the power detecting circuit 10 detects the forward wave voltage $v_f$ and the reflected wave voltage $v_r$ included in the radio-frequency voltage $v_{out}$. Then, the power detecting circuit 10 converts the forward wave voltage $v_f$ into forward wave power $P_f$ and outputs it to the controlling circuit 9. Alternatively, the reflected wave voltage $v_r$ may be converted into reflected wave power Pr and outputted to the controlling circuit 9.

The PWM signal generating circuit 7 generates PWM signals $S_{PWM}$ for driving the DC-DC converting circuit 3, and outputs them to the DC-DC converting circuit 3. The PWM signal generating circuit 7 generates the PWM signals $S_{PWM}$ according to a preset PWM duty ratio. When it is necessary to increase the DC voltage $V_{dc}$ outputted from the DC-DC converting circuit 3, the duty ratio is set to be an appropriately large value. When it is necessary to reduce the DC voltage $V_{dc}$ outputted from the DC-DC converting circuit 3, the duty ratio is set to be an appropriately small value. As described later, the PWM duty ratio is set based on the target output power $P_{fs1}$ of the high level period of the pulse. To this end, for example, a table or a relational formula defining the relationships between the target output power $P_{fs1}$ and the PWM duty ratio may be previously given. Then, the PWM duty ratio can be set based on the table or the relational formula. As long as the target output power $P_{fs1}$ is not changed, the PWM duty ratio is constant, and the DC voltage $V_{dc}$ outputted from the DC-DC converting circuit 3 is also constant.

The radio-frequency signal generating circuit 8 generates the radio-frequency voltage $v_a$ and the radio-frequency voltage $v_b$, where the radio-frequency voltage $v_a$ controls the driving of the semiconductor switch elements $Q_B$ in the first DC-RF converting circuit 4A, and the radio-frequency voltage $v_b$ controls the driving of the semiconductor switch elements $Q_B$ in the second DC-RF converting circuit 4B. The radio-frequency signal generating circuit 8 generates the radio-frequency voltages $v_a$, $v_b$ based on information inputted from the controlling circuit 9, such as amplitude A, output frequency f and phase difference $\theta$, while also outputting the radio-frequency voltage $v_a$ to the first DC-RF converting circuit 4A, and the radio-frequency voltage $v_b$ to the second DC-RF converting circuit 4B.

Figure 7:
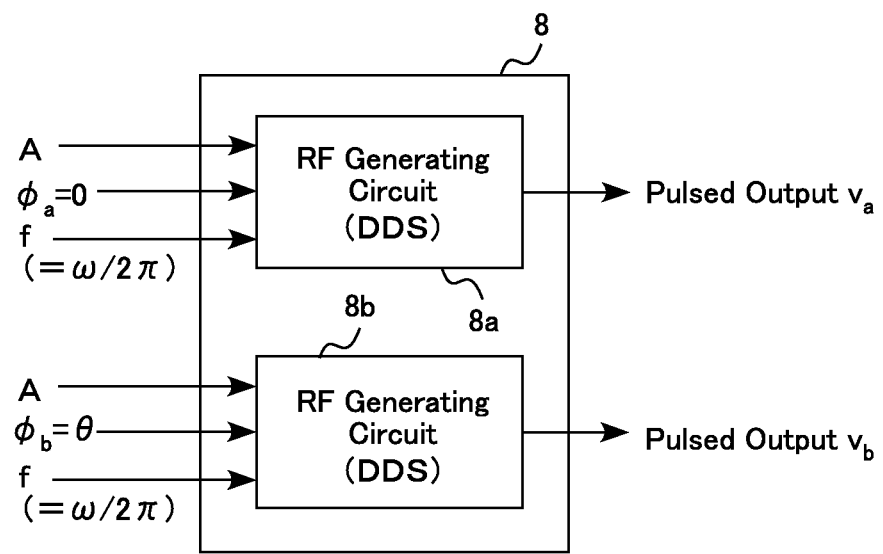
FIG. 7 shows the internal configuration of a radio-frequency signal generating circuit and illustrates a radio-frequency signal generating method.

As shown in FIG. 7, the radio-frequency signal generating circuit 8 includes a first radio-frequency generating circuit 8a for generating a sinusoidal radio-frequency voltage $v_a$ and a second radio-frequency generating circuit 8b for generating a sinusoidal radio-frequency voltage $v_b$, where the radio-frequency voltage $v_b$ is caused to have a phase difference $\theta$ with respect to the radio-frequency voltage $v_a$ in response to the phase difference $\theta$ inputted from the controlling circuit 9. The first radio-frequency generating circuit 8a and the second radio-frequency generating circuit 8b are each provided by a direct digital synthesizer.

The following information regarding the radio-frequency voltage $v_a$, that is, the amplitude A, the output frequency f, and the initial phase $\varphi_a$ (=0 [deg]) are inputted from the controlling circuit 9 to the first radio-frequency generating circuit 8a. As noted above, the output frequency f is 2.0 MHz or 13.56 MHz, for example, chosen for plasma processing systems. The initial phase $\varphi_a$ can be set to an arbitrary value, but in the present embodiment it is set to 0 [deg]. Similarly, the following information regarding the radio-frequency voltage $v_b$, that is, the amplitude A, the output frequency f, and the initial phase $\varphi_b$ are inputted to the second radio-frequency generating circuit 8b. Since $\theta=\varphi_b-\varphi_a$ and $\varphi_a=0$ [deg], the phase value $\theta$ outputted from the controlling circuit 9 is inputted as the information of the initial phase $\varphi_b$. When $\varphi_a \neq 0$ [deg], a value ($\theta+\varphi_a$) obtained by adding the initial phase $\varphi_a$ to the phase difference $\theta$ outputted from the controlling circuit 9 is inputted as information of the initial phase $\varphi_b$. The amplitude A and the output frequency f inputted to the second radio-frequency generating circuit 8b are the same as the amplitude A and the output frequency f inputted to the first radio-frequency generating circuit 8a. When the amplitude A and the output frequency f are to be fixed, the information regarding these fixed values may be preset in the first and second radio-frequency generating circuits 8a, 8b.

Figure 8:
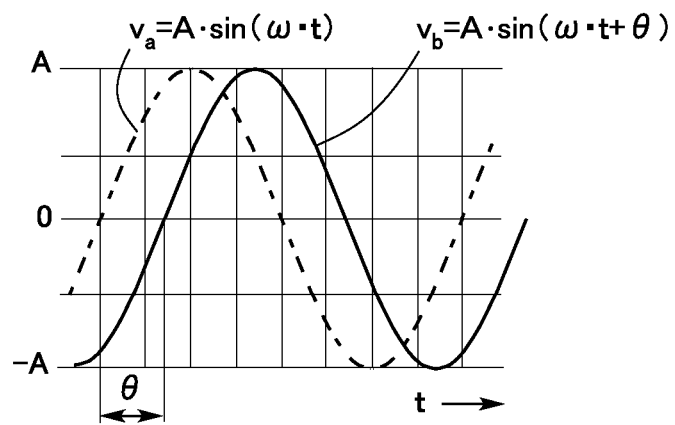
FIG. 8 shows two radio-frequency signals outputted from the radio-frequency signal generating circuit.

The first radio-frequency generating circuit 8a generates a radio-frequency voltage $v_a$ (digital signal; see $v_a$ in FIG. 8) represented by $A \cdot \sin(2\pi f \cdot t) = A \cdot \sin(\omega \cdot t)$ based on the information of the amplitude A, the output frequency f and the initial phase $\varphi_a$. Similarly, the second radio-frequency generating circuit 8b generates a radio-frequency voltage $v_b$ (digital signal; see $v_b$ in FIG. 8) represented by $A \cdot \sin(2\pi f \cdot t) = A \cdot \sin(\omega \cdot t)$ based on the information of the amplitude A, the output frequency f and the control command value ($\theta$).

The controlling circuit 9 controls the forward wave power $P_f$ outputted from the radio-frequency power source 1 and the phase difference $\theta$ between the two radio-frequency voltages $v_a$ and $v_b$ generated by the first and second radio-frequency generating circuits 8a and 8b. The controlling circuit 9 is configured by a microcomputer including a CPU (Central Processing Unit), a ROM (Read Only Memory), and a RAM (Random Access Memory). The CPU executes control programs stored in the ROM to control the forward wave power $P_f$ and the phase difference $\theta$ between the two radio-frequency voltages $v_a$, $v_b$.

The controlling circuit 9 receives the input of the pulse frequency of the pulsed radio-frequency power and the input of the duty ratio ("pulse duty ratio") between the first and second levels of the pulsed radio-frequency power. This input may be initiated by the user using an input device (not shown) or initiated automatically by a preset program. In an embodiment, the pulse frequency (for example, 10 kHz) is lower (i.e., longer in cycle) than that of the radio-frequency voltages $v_a$, $v_b$, and the pulse duty ratio is, for example, 50%. Based on the pulse frequency and the pulse duty ratio, the controlling circuit 9 generates an output control signal for specifying the pulse waveform of the pulsed radio-frequency power. Then, the controlling circuit 9 switches the phase difference $\theta$ so that the phase difference becomes a first phase difference $\theta 1$ during the high level period of the output control signal and a second phase difference $\theta 2$ during the low level period of the output control signal.

When the phase difference $\theta$ becomes the first phase difference $\theta 1$ during the high level period of the output control signal, the phase difference $\theta$ between the radio-frequency voltages $v_a$, $v_b$ outputted from the radio-frequency signal generating section 8 becomes the same phase difference $\theta 1$. Also, the phase difference $\theta$ between the radio-frequency voltage $v_{PA}$ outputted from the first DC-RF converting circuit 4A and the radio-frequency voltage $v_{PB}$ outputted from the second DC-RF converting circuit 4B becomes the same phase difference $\theta 1$. Then, the output power $P_X$ combined in accordance with the first phase difference $\theta 1$ is outputted from the RF combining circuit 5. In the present embodiment, the first phase difference $\theta 1$ is 20 [deg]. Thus, the output power $P_X$ during the high level period is about 95% of $P_{in}$, which is the sum of the power $P_A$ outputted from the first DC-RF converting circuit 4A and the power $P_B$ outputted from the second DC-RF converting circuit 4B (approximately 5% of the power $P_{in}$ is thermally consumed by the RF combining circuit 5).

Likewise, when the phase difference $\theta$ becomes the second phase difference $\theta 2$ during the low level period of the output control signal, the phase difference $\theta$ between the radio-frequency voltages $v_a$, $v_b$ outputted from the radio-frequency signal generating section 8 becomes the same phase difference $\theta 2$. Also, the phase difference $\theta$ between the radio-frequency voltage $v_{PA}$ outputted from the first DC-RF converting circuit 4A and the radio-frequency voltage $v_{PB}$ outputted from the second DC-RF converting circuit 4B becomes the same phase difference $\theta 2$. Then, the output power $P_X$ combined in accordance with the second phase difference $\theta 2$ is outputted from the RF combining circuit 5. In the present embodiment, the second phase difference $\theta 2$ is 160 [deg]. Thus, the output power $P_X$ during the low level period is about 5% of the power $P_{in}$ (approximately 95% of the power $P_{in}$ is thermally consumed by the RF combining circuit 5).

In the above manner, the output power $P_X$ outputted from the RF combining circuit 5 corresponds to pulsed radio-frequency power having a high level period which occupies about 95% of the power $P_{in}$ and a low level period which occupies about 5% of the power $P_{in}$.

FIG. 9 shows the waveform of the radio-frequency voltage $v_{PX}$ outputted from the RF combining circuit 5. The radio-frequency voltage $v_{PX}$ becomes high-level with a large amplitude when the phase difference $\theta$ is the first phase difference $\theta 1$, and becomes low-level with a small amplitude when the phase difference $\theta$ is the second phase difference $\theta 2$. In this manner, the radio-frequency power $P_X$ outputted from the RF combining circuit 5 takes a pulse form.

Further, the controlling circuit 9 performs predetermined feedback control so that the radio-frequency power (forward wave power $P_f$) outputted from the radio-frequency power source 1 to the load is adjusted to become a target power. As the target power, a target output power $P_{fs1}$ is set for the high level period, and a target output power $P_{fs2}$ is set for the low level period. The user may manually input the target output powers $P_{fs1}$ and $P_{fs2}$ by operating an input device (not shown). Alternatively, the target output powers $P_{fs1}$ and $P_{fs2}$ may be automatically inputted by a program provided in advance.

During the high level period of the output control signal, the controlling circuit 9 calculates the deviation $\Delta P1$ ($=P_{fs1}-P_f$) between the detected value of the forward wave power $P_f$ inputted from the power detecting circuit 10 and the target output power $P_{fs1}$. Also, based on the deviation $\Delta P1$, the controlling circuit 9 generates a control command value for making the deviation $\Delta P1$ zero. Then, the controlling circuit 9 changes the first phase difference $\theta 1$ based on the control command value, thereby controlling the forward wave power $P_f$. In this manner, feedback control is performed so that the forward wave power $P_f$ becomes the target output power $P_{fs1}$. Likewise, during the low level period of the output control signal, the controlling circuit 9 calculates the deviation $\Delta P2$ ($=P_{fs2}-P_f$) between the detected value of the forward wave power $P_f$ inputted from the power detecting circuit 10 and the target output power $P_{fs2}$. Also, based on the deviation $\Delta P2$, the controlling circuit 9 generates a control command value for making the deviation $\Delta P2$ zero. Then, the controlling circuit 9 changes the second phase difference $\theta 2$ based on the control command value, thereby controlling the forward wave power $P_f$. In this manner, feedback control is performed so that the forward wave power $P_f$ becomes the target output power $P_{fs2}$.

In an embodiment, the control of the forward wave power $P_f$ may be performed by changing the DC voltage $V_{dc}$ outputted from the DC-DC converting circuit 3, instead of changing the first and second phase differences θ1, θ2. Specifically, the control command value generated by the controlling circuit 9 is outputted to the PWM signal generating circuit 7, and the PWM signal generating circuit 7 generates, based on the received control command value and a carrier signal generated by the PWM signal generating circuit 7, a PWM signal $S_{PWM}$ using a triangular wave comparison method. Further, the output power control may be performed by arranging that the controlling circuit 9 changes, based on the control command value, the amplitude A outputted to the radio-frequency signal generating circuit 8.

As described above, in the radio-frequency power source 1 of the present embodiment, there are provided two DC-RF converting circuits, that is, the first DC-RF converting circuit 4A and the second DC-RF converting circuit 4B, together with an RF combining circuit 5 for combining the radio-frequency powers $P_A$ and $P_B$ of the respective DC-RF converting circuits 4A and 4B. In addition, the phase difference θ between the radio-frequency voltages $v_a$ and $v_b$ inputted to the first and second DC-RF converting circuits 4A and 4B is switched between the first phase difference θ1 and the second phase difference θ2. As a result, the output power $P_X$ outputted from the RF combining circuit 5 is about 95% of the power $P_{in}$ for the first phase difference θ1, and is about 5% of the power $P_{in}$ for the second phase difference θ2. In other words, pulsed radio-frequency power having a high level period and a low level period is outputted. Since switching of the phase difference θ can be performed at high speed, the outputted, pulsed radio-frequency power has a high pulse frequency regarding the switching between the first level and the second level.

Further, in the radio-frequency power source 1 of the present embodiment, it is possible to output the pulsed radio-frequency power while the DC voltage $V_{dc}$ outputted from the DC-DC converting circuit 3 is kept constant (when the target output power $P_{fs1}$ is constant). Thus, no overshoot or undershoot occurs which would otherwise occur due to the change in the DC voltage $V_{dc}$.

In the above embodiment, the case where the forward wave power $P_f$ is controlled to follow or converge to the control target is described as an example, though the present disclosure is not limited thereto. For example, the radio-frequency power (forward wave power $P_f$-reflected wave power Pr) supplied to the load that may be controlled to follow or converge to a control target.

In the above embodiment, the first and second DC-RF converting circuits 4A, 4B of the same configuration are used for the DC-RF converting circuit 4, and the output powers $P_A$, $P_B$ of the DC-RF converting circuits 4A, 4B are combined by the RF combining circuit 5. Alternatively, use may be made of three or more DC-RF converting circuits, and their output powers may be combined together.

Figure 10:
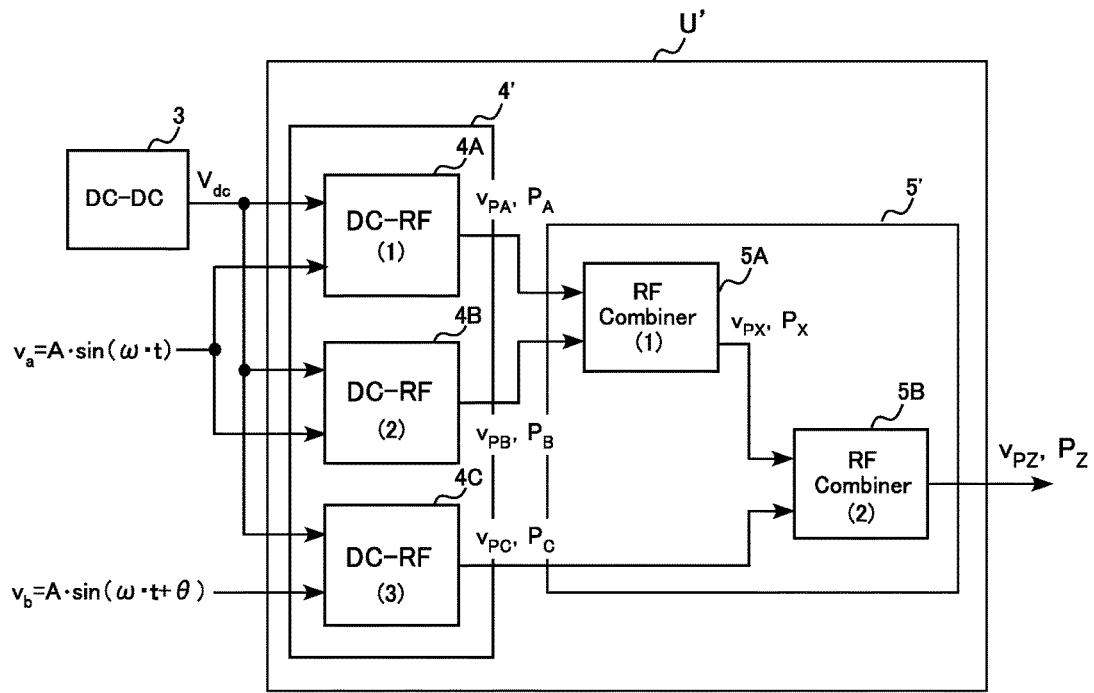
FIG. 10 shows a block configuration example including three DC-RF converting circuits and two RF combining circuits.
Figure 11:
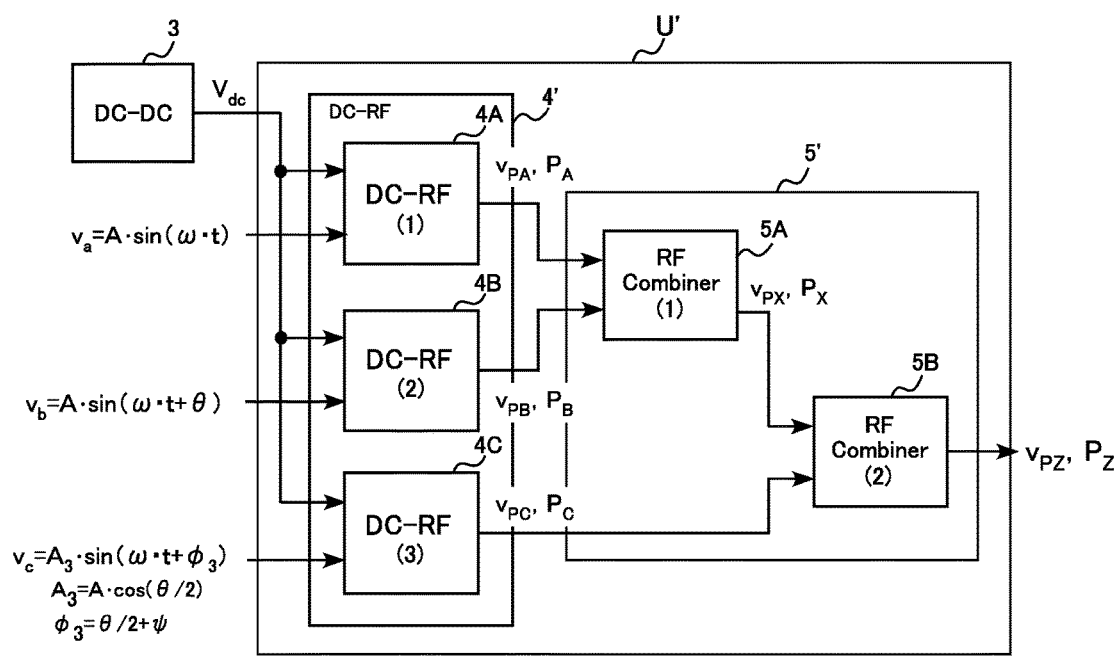
FIG. 11 shows another block configuration example including three DC-RF converting circuits and two RF combining circuits.

FIGS. 10-11 show a circuit configuration of a radio-frequency generating circuitry U' provided with a DC-RF converting circuit 4', including three DC-RF converting circuits of the same configuration, and an RF combining circuit 5'. The DC-RF converting circuit 4' includes a third DC-RF converting circuit 4C in addition to first and second DC-RF converting circuits 4A, 4B, where the third DC-RF converting circuit 4C has the same configuration as the other two circuits. The RF combining circuit 5' is provided with first and second RF combining circuits 5A, 5B of the same structure as the RF combining circuit 5.

The circuit configuration shown in FIGS. 10-11 may correspond to that in which the third DC-RF converting circuit 4C and the second RF combining circuit 5B are added to the DC-RF converting circuit 4 and the RF combining circuit 5 shown in FIG. 1, and in which the output powers of the combining circuit 5A and third DC-RF converting circuit 4C are combined by the second RF combining circuit 5B.

For providing three DC-RF converting circuits of the same configuration, use may be made of two methods as follows. According to a first method, the output voltages $v_{PA}$, $v_{PB}$ of the first and second DC-RF converting circuits 4A, 4B in the DC-RF converting circuit 4' are driven with the phase difference θ=0, and the output voltage $v_{PC}$ of the third DC-RF converting circuit 4C is driven with the phase difference θ with respect to the output voltages $v_{PA}$ and $v_{PB}$. According to a second method, the output voltage $v_{PB}$ of the second DC-RF converting circuit 4B is driven with the phase difference θ with respect to the output voltage $v_{PA}$ of the first DC-RF converting circuit 4A, and the output voltage $v_{PC}$ of the third RF converting circuit 4C is driven with a phase difference ψ with respect to the output voltage $v_{PX}$ of the first RF combining circuit 5A.

FIG. 10 shows the circuit configuration of the DC-RF converting circuit 4' and the RF combining circuit 5' for the first method. FIG. 11 shows the circuit configuration of the DC-RF converting circuit 4' and the RF combining circuit 5' for the second method.

According to the first method illustrated in FIG. 10, it is possible to replace the portion composed of the first and second DC-RF converting circuits 4A-4B and the first RF combining circuit 5A with an equivalent DC-RF converting circuit. Thus, the radio-frequency generating circuitry U' is substantially the same as the above-described radio-frequency generating circuitry U (FIG. 1). Specifically, the first RF combining circuit 5A combines the output power $P_A$ of the first DC-RF converting circuit 4A and the output power $P_B$ of the second DC-RF converting circuit 4B with no power loss. Further, the second RF combining circuit 5B adjusts the output power $P_Z$ to the load in accordance with the phase difference θ.

It is supposed that the waveforms of the radio-frequency signals $v_1$, $v_2$, $v_3$ inputted to the first, second and third DC-RF converting circuits 4A, 4B, 4C are represented by $v_1 = A_1 \cdot \sin(\omega \cdot t + \varphi_1)$, $v_2 = A_2 \cdot \sin(\Omega \cdot t + \varphi_2)$, $v_3 = A_3 \cdot \sin(\omega \cdot t + \varphi_3)$. In the first method of FIG. 10, for example, a radio-frequency signal $v_a = A \cdot \sin(\omega t)$ ($A_1 = A_2 = A$, $\varphi_1 = \varphi_2 = 0$) is inputted to the first and second DC-RF converting circuits 4A and 4B.

It is assumed that the input port and the output port of the RF combining circuits 5A and 5B are matched. Then, the output voltages $v_{PA}$, $v_{PB}$ of the first and second DC-RF converting circuits 4A, 4B are represented by $v_{PA} = v_{PB} = V \cdot \sin(\omega \cdot t)$. Thus, by equation (8), the output voltage $v_{PX}$ of the first RF combining circuit 5A is represented by $V_{PX} = V \cdot \sin(\omega \cdot t)$. Therefore, when a radio-frequency signal $v_b = A \cdot \sin(\omega \cdot t + \theta)$ ($A_3 = A$, $\varphi_3 = \theta$) is inputted to the third DC-RF converting circuit 4C, and $v_{PC} = V \cdot \sin(\omega \cdot t + \theta)$ is outputted from the third DC-RF converting circuit 4C, then the following output voltage $v_{PZ}$ is obtained from the second RF combining circuit 5B.

$$V_{PZ} = V \cdot \cos(\theta/2) \cdot \sin(\omega \cdot t + \theta/2)$$

The output powers $P_A$ and $P_B$ of the first and second DC-RF converting circuits 4A and 4B are combined by the first RF combining circuit 5A, without being thermally consumed. Thus, the power $P_X$ (=$P_A$+$P_B$) is outputted from the first RF combining circuit 5A. In the second RF combining circuit 5B, the output power $P_X$ and the output power PC of the third DC-RF converting circuit 4C are combined as shown in equation (9), and the following power $P_Z$ is outputted.

$$P_Z=2\cdot[V\cdot\cos(\theta/2)]^2\cdot\sin^2(\omega\cdot t+\theta/2)/R_o$$

Thus, in the first method of FIG. 10, switching the phase difference θ between the first phase difference θ1 and the second phase difference θ2 makes it possible to change the combining amount for the output power $P_X$ (=$P_A$+$P_B$) of the first and second DC-RF converting circuits 4A-4B and the output power PC of the third DC-RF converting circuit 4C, thereby producing the pulsed radio-frequency power $P_Z$.

By the second method of FIG. 11, both the first RF combining circuit 5A and the second RF combining circuit 5B adjust the output power $P_Z$ to the load. Supposing that the first and second DC-RF converting circuits 4A, 4B receive the inputs of radio-frequency signals, respectively, denoted by $v_a$=A·sin(ω·t) where $\varphi_1$=0 and $v_b$=A·sin(ω·t+θ) where $\varphi_2$=θ, and that the first and second DC-RF converting circuits 4A, 4B output voltages, respectively, denoted by $v_{PA}$=V·sin(ω·t) and $v_{PB}$=V·sin(ω·t+θ). In this situation, in light of equation (8), the voltage $v_{PX}$ outputted from the first RF combining circuit 5A is expressed as follows.

$$v_{PX}=V\cdot\cos(\theta/2)\cdot\sin(\omega\cdot t+\theta/2)$$

In addition, if it is arranged that a radio-frequency signal denoted by $v_C$=$A_3$·sin(ω·t+$\varphi_3$) is inputted to the third DC-RF converting circuit 4C, where $A_3$=A·cos(θ/2) and $\varphi_3$=θ/2+ψ, implying that the amplitudes $A_3$ and $\varphi_3$ are adjusted depending on the phase difference θ, and also that voltage $v_{PC}$ denoted by V·cos(θ/2)·sin(ω·t+θ/2ψ) is outputted from the third DC-RF converting circuit 4C, then the following voltage $v_{PZ}$ and power $P_Z$ are outputted from the second RF combining circuit 5B.

$$v_{PZ}=V\cdot\cos(\theta/2)\cdot\cos(\psi/2)\cdot\sin(\omega\cdot t+\theta/2+\psi/2)$$

$$P_Z=2\cdot[V\cdot\cos(\theta/2)\cdot\cos(\psi/2)]^2\cdot\sin^2(\omega\cdot t+\theta/2+\psi/2)/R_o$$

As noted above, according to the second method illustrated in FIG. 11, it is possible to output the power $P_Z$ as pulsed radio-frequency power in two different modes. First, while fixing the phase difference ψ, the phase difference θ is switched between the first phase difference θ1 and the second phase difference θ2. Second, as opposite to the first mode, while the phase difference θ is fixed, the phase difference ψ is switched between ψ1 and ψ2. More specifically, by switching the phase difference θ between the first phase difference θ1 and the second phase difference θ2, the combining amount between the output power $P_A$ of the first DC-RF converting circuit 4A and the output power $P_B$ of the second DC-RF converting circuit 4B can be switched, thereby producing pulsed radio-frequency power as the power $P_Z$. Alternatively, by switching the phase difference ψ between ψ1 and ψ2, it is possible to switch the combining amount between the combined power Px of the output powers $P_A$, $P_B$ from the first and second DC-RF converting circuits 4A, 4B and the output power Pc from the third DC-RF converting circuit 4C, thereby producing pulsed radio-frequency power as the power $P_Z$.

Figure 12:
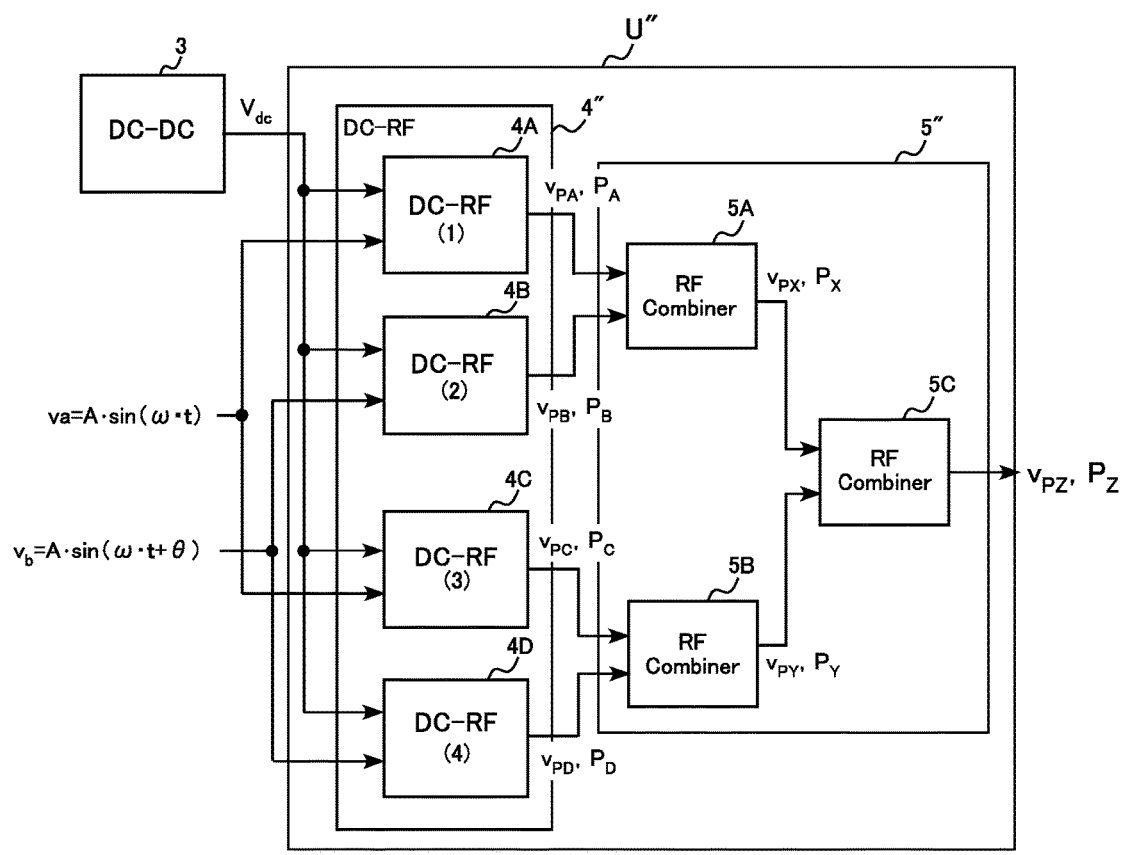
FIG. 12 shows a block configuration example including four DC-RF converting circuits and three RF combining circuits.
Figure 13:
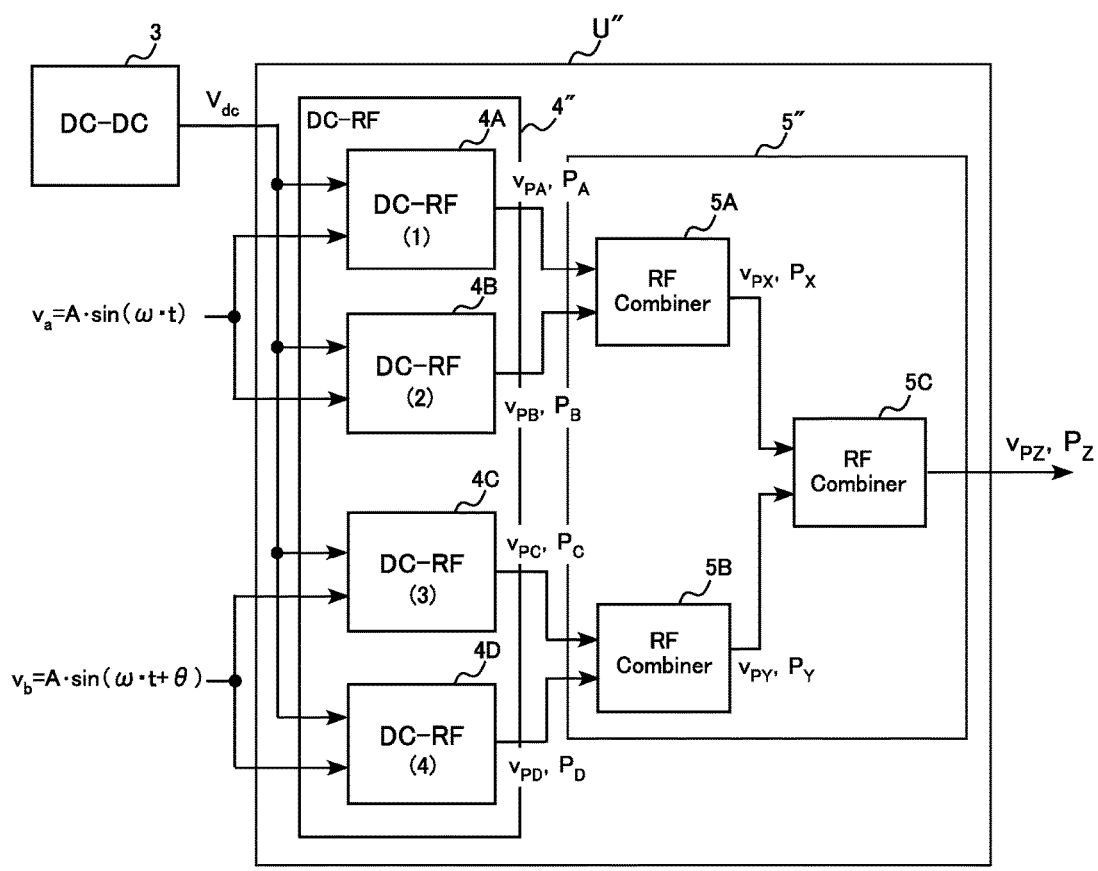
FIG. 13 shows another block configuration example including four DC-RF converting circuits and three RF combining circuits.

FIGS. 12-13 show the circuit configuration of the radio-frequency generating circuitry U" that includes a DC-RF converting circuit 4" with four DC-RF converting circuits of the same configuration and an RF combining circuit 5". In the DC-RF converting circuit 4", there are additions of third and fourth DC-RF converting circuits 4C, 4D having the same configuration as the first and second DC-RF converting circuits 4A, 4B. The RF combining circuit 5" is provided with a first RF combining circuit 5A, a second RF combining circuit 5B and a third RF combining circuit 5C each having the same configuration as the RF combining circuit 5.

The first RF combining circuit 5A of the RF combining circuit 5" combines the output power $P_A$ from the first DC-RF converting circuit 4A of the DC-RF converting circuit 4" and the output power $P_B$ from the second DC-RF converting circuit 4B. The second RF combining circuit 5B combines the output power $P_C$ from the third DC-RF converting circuit 4C of the DC-RF converting circuit 4" and the output power $P_D$ from the fourth DC-RF converting circuit 4D. The third RF combining circuit 5C of the RF combining circuit 5" combines the output power $P_X$ from the first RF combining circuit 5A and the output power $P_Y$ from the second RF combining circuit 5B.

There may be two methods practicable for providing four DC-RF converting circuits of the same configuration. In the first method, a phase difference θ is provided between the output voltage $v_{PA}$ of the first DC-RF converting circuit 4A and the output voltage $v_{PB}$ of the second DC-RF converting circuit 4B, as well as between the output voltage $v_{PC}$ of the third DC-RF converting circuit 4C and the output voltage $v_{PD}$ of the fourth DC-RF converting circuit 4D. This first method corresponds to providing two pairs of DC-RF converting circuit 4 and RF combining circuit 5 shown in FIG. 1 and combining the two powers outputted from the respective pairs.

FIG. 12 shows the circuit configuration of the DC-RF converting circuit 4" and RF combining circuit 5" related to the first method. Generally, the radio-frequency signals $v_1$, $v_2$, $v_3$, $v_4$ inputted to the first through fourth DC-RF converting circuits 4A, 4B, 4C, 4D have waveforms denoted by $v_1$=$A_1$·sin(ω·t+$\varphi_1$), $v_2$=$A_2$·sin(ω·t+$\varphi_2$), $v_3$=$A_3$·sin(ω·t+$\varphi_3$), and $v_4$=$A_4$·sin(ω·t+$\varphi_4$). By the first method, $v_1$=$v_a$=A·sin (ω·t) where $A_1$=A, $\varphi_1$=0, $v_2$=$v_b$=A·sin(ω·t+θ) where $A_2$=A and $\varphi_2$=θ, $v_3$=$v_a$=A·sin(ω·t) where $A_3$=A, $\varphi_3$=0, and $v_4$=$v_b$=A·sin(ω·t+θ) where $A_4$=A, $\varphi_4$=θ.

By the circuit configuration shown in FIG. 12, the first RF combining circuit 5A combines, by the prescribed ratio depending on the phase difference θ, the output power $P_A$ from the first DC-RF converting circuit 4A and the output power $P_B$ from the second DC-RF converting circuit 4B. Similarly, the second RF combining circuit 5B combines, by a prescribed ratio depending on the phase difference θ, the output power PC from the third DC-RF converting circuit 4C and the output power PD from the fourth DC-RF converting circuit 4D.

Assuming that the input ports of the RF combining circuits 5A, 5B and 5C are matched, the output power $P_X$ from the first RF combining circuit 5A and the output power $P_Y$ from the second RF combining circuit 5B are denoted as follows by equation (9).

$$P_X=P_Y=2\cdot V^2\cdot\cos^2(\theta/2)\cdot\sin^2(\omega\cdot t+\theta/2)/R_o$$

Further, in the third RF combining circuit 5C, the output powers $P_X$, $P_Y$ are not thermally consumed. Thus, the third RF combining circuit 5C outputs the following output power $P_Z$ to the load.

$$P_Z=P_X+P_Y=4\cdot V^2\cdot\cos^2(\theta/2)\cdot\sin^2(\omega\cdot t+\theta/2)/R_o$$

In the first method of FIG. 12, the switching of the phase difference θ between the first phase difference θ1 and the second phase difference θ2 makes it possible to change the combining amount of the output power $P_A$ from the first DC-RF converting circuit 4A and the output power $P_B$ from the second DC-RF converting circuit 4B, thereby outputting pulsed radio-frequency power as the power $P_X$, while also outputting pulsed radio-frequency power as the power $P_Y$ by changing the combining amount of the output power Pc from the third DC-RF converting circuit 4C and the output power PD from the fourth DC-RF converting circuit 4D. Then, the power $P_X$ and the power $P_Y$ are combined by the third RF combining circuit 5C and outputted as pulsed radio-frequency power for the power $P_Z$.

According to the second method, the output voltage $v_{PA}$ from the first DC-RF converting circuit 4A and the output voltage $v_{PB}$ from the second DC-RF converting circuit 4B are controlled with the same phase. Similarly, the output voltage $v_{PC}$ from the third DC-RF converting circuit 4C and the output voltage $v_{PD}$ from the fourth DC-RF converting circuit 4D are controlled with the same phase. Further, a phase difference θ is provided between the output voltage $v_{PX}$ from the first RF combining circuit 5A and the output voltage $v_{PY}$ from the second RF combining circuit 5B.

FIG. 13 shows the circuit configuration of the DC-RF converting circuit 4″ and the RF combining circuit 5″ used for implementing the second method. According to the illustrated circuit configuration of FIG. 13, the first RF combining circuit 5A combines the output power $P_A$ from the first DC-RF converting circuit 4A and the output power $P_B$ from the second DC-RF converting circuit 4B with no power loss, and the second RF combining circuit 5B combines the output power Pc from the third DC-RF converting circuit 4C and the output power PD from the fourth DC-RF converting circuit 4D with no power loss. Then, the third RF combining circuit 5C combines the output power $P_X$ from the first RF combining circuit 5A and the output power $P_Y$ from the second RF combining circuit 5B at a predetermined ratio depending on the phase difference θ.

Supposing that the radio-frequency signals $v_1$, $v_2$ inputted to the first and second DC-RF converting circuits 4A, 4B are denoted by $v_1=v_2=v_a=A\cdot\sin(\omega\cdot t)$, where $A_1=A_2=A$ and $\varphi_1=\varphi_2=0$, the output voltage $v_{PX}$ from the first RF combining circuit 5A is given as follows in light of equation (8).

$V_{PX}=V\cdot\sin(\omega\cdot t)$

Further, supposing that the radio-frequency signals $v_3$, $v_4$ inputted to the third and fourth DC-RF converting circuits 4C, 4D are denoted by $v_3=v_4=v_b=A\cdot\sin(\omega\cdot t+\theta)$, where $A_3=A_4=A$ and $\varphi_3=\varphi_4=\theta$, the output voltage $v_{PY}$ from the second RF combining circuit 5B is as follows in light of equation (8).

$V_{PY}=V\cdot\sin(\omega\cdot t+\theta)$

Thus, the third RF combining circuit 5C outputs the following voltage $v_{PZ}$ in light of equation (8).

$V_{PZ}=V\cdot\cos(\theta/2)\cdot\sin(\omega\cdot t+\theta/2)]$

Also, in light of equation (9), the following power $v_{PZ}$ is outputted to the load.

$P_Z=2\cdot[V\cdot\cos(\theta/2)]^2\cdot\sin^2(\omega\cdot t+\theta/2)/R_o$

Thus, in accordance with the second method of FIG. 13, it is possible, by switching the phase difference θ between the first phase difference θ1 and the second phase difference θ2, to switch the combining amount of the output power $P_X$ (=$P_A$+$P_B$) from the first RF combining circuit 5A and the output power $P_Y$ (=$P_C$+$P_D$) from the second RF combining circuit 5B, thereby producing pulsed radio-frequency power as the power $P_Z$.

In the embodiment of FIG. 1, the initial phase $\varphi_a$ of the output voltage $v_{PA}$ from the first DC-RF converting circuit 4A is fixed, while the initial phase $\varphi_b$ of the output voltage $v_{PB}$ from the second DC-RF converting circuit 4B is changed, and thus the phase difference $\theta=\varphi_b-\varphi_a$ is changed. Alternatively, the phase difference $\theta=\varphi_b-\varphi_a$ may be changed with the initial phase $\varphi_b$ fixed while the initial phase $\varphi_a$ is changed. Further, the change of the phase difference $\theta=\varphi_b-\varphi_a$ may be implemented by changing both the initial phases $\varphi_a$ and $\varphi_b$.

Figure 14:
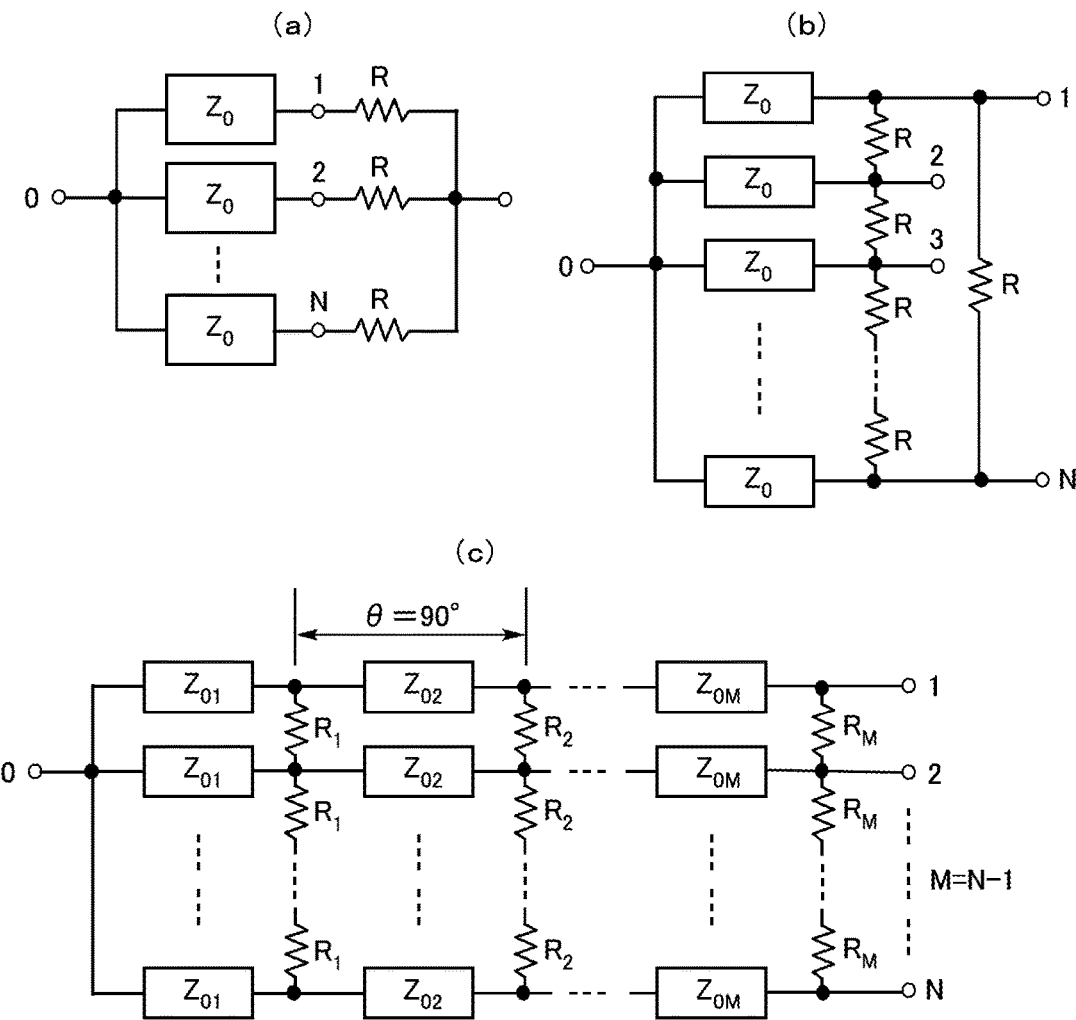
FIG. 14 shows examples of circuits for constituting an RF combining circuit to combine the input of three or more powers.

The above description of the embodiment relates to a circuit configuration in which the RF combining circuit 5 combines two RF powers. Alternatively, the RF combining circuit 5 may be configured to combine three or more RF powers. As a circuit configured for three or more RF powers, use may be made of circuits shown in FIG. 14.

For example, use may be made of a circuit shown in FIG. 14(b) for combining three RF powers. It is now assumed that the voltages inputted to the input terminals 1, 2, 3 are expressed as follows: $v_a=A\cdot\sin(\omega\cdot t+\varphi_a)$, $v_b=B\cdot\sin(\omega\cdot t+\varphi_b)$ and $v_c=C\cdot\sin(\omega\cdot t+\varphi_c)$, and that their effective values are denoted by $V_{arms}$, $V_{brms}$ and $V_{crms}$. Power $P_a=V_{arms}^2/R$, $P_b=V_{brms}^2/R$, and $P_c=V_{crms}^2/R$ are inputted to the power combining circuit. If not $v_a=v_b=v_c$, then differential voltages $v_{ab}=v_a-v_b$, $v_{bc}=v_b-vc$, $v_{ca}=v_c-v_a$ are applied to the three resistors R, respectively. Supposing that the effective values of the differential voltages $v_{ab}$, $v_{bc}$, $v_{ca}$ are $V_{abrms}$, $V_{bcrms}$ and $V_{carms}$, power $P_{ab}=V_{abrms}^2/R$, $P_{bc}=V_{bcrms}^2/R$, and $P_{ca}=V_{carms}^2/R$ are thermally consumed by the three resistors R, respectively.

Thus, by providing phase differences $\theta_{ab}$, $\theta_{bc}$ and $\theta_{ca}$ between the input voltages $v_a$, $v_b$ and $v_c$, it is possible to thermally consume a part ($P_{ab}+P_{bc}+P_{ca}$) of the inputted power $P_{in}=P_a+P_b+P_c$, and to output the remaining power, $P_{in}-(P_{ab}+P_{bc}+P_{ca})$, from the power combining circuit to the load. The same applies to a case where four or more RF powers are inputted.

Figure 15:
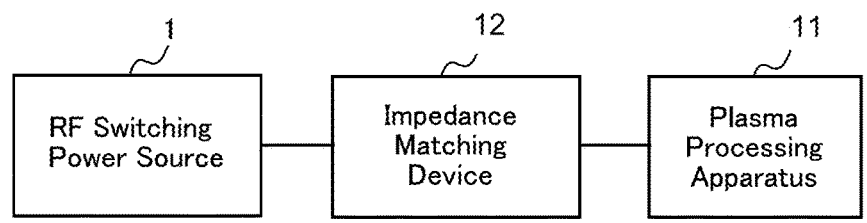
FIG. 15 shows a configuration of a plasma processing system with an impedance matching device included.

In the above embodiment, the output control of the radio-frequency power source 1 is described by taking the plasma processing system as an example, where a plasma processing apparatus is connected as the load to the radio-frequency power source 1. Alternatively, as shown in FIG. 15, the present invention may also be applied to a case where an impedance matching device 12 is provided between the radio-frequency power source 1 and the plasma processing apparatus 11.

When the impedance matching device 12 is provided, impedance matching between the radio-frequency power source 1 and the plasma processing apparatus 11 is performed by the impedance matching device 12 even if the impedance (load impedance) of the plasma processing device 8 fluctuates. However, in the transient period in which the impedance matching process by the impedance matching device 12 is being performed, the impedance mismatch can occur. Thus, even in the plasma processing system including the impedance matching device 12, the output control method for the radio-frequency power source 1 of the present invention is effective.

The above embodiment includes a radio-frequency generating circuitry U for combining a plurality of radio-frequency powers, and by switching the phase difference θ, for example, between the first phase difference θ1 and the second phase difference θ2, pulsed radio-frequency power with a high level period and a low level period is outputted. It should be note here that that gist of the above described techniques is not limited to a radio-frequency power source for a plasma processing system.

In the above embodiment, the radio-frequency voltage $V_{out}$ outputted to the load has a sinusoidal waveform. Alternatively, it may have a trapezoidal waveform or a rectangular waveform with a dead time.

In the above embodiment, the phase difference θ outputted to the radio-frequency signal generating circuit 8 from the controlling circuit 9 is switched between two values θ1 and θ2, thereby switching the amplitude of radio-frequency power between the first level and the second level, for outputting pulsed radio-frequency power. The present invention is not limited to this. For example, the amplitude of the radio-frequency power may be switched among three or more levels.

The waveform shown in FIG. 16(*a*) corresponds to the case where the amplitude of the radio-frequency voltage $v_{PX}$ outputted from the RF combining circuit 5 is switched among three levels. By switching the phase difference θ outputted to the radio-frequency signal generating circuit 8 from the controlling circuit 9 among three levels such as a first phase difference θ1 (For example 20 [deg]), a second phase difference θ2 (for example 90 [deg]), and a third phase difference θ3 (for example 160 [deg]), the waveform of the radio-frequency voltage $v_{PX}$ outputted from the RF combining circuit 5 changes among three levels, as shown in FIG. 16(*a*). Accordingly, the radio-frequency power $P_X$ outputted from the RF combining circuit 5 is switched in amplitude among three levels.

Instead of switching the phase difference θ among predetermined fixed values, the phase difference θ may be a function of time t, varying with time.

For example, let the phase difference θ be a linear function θ=a·t+b (a, b are constant) depending on time t. In this case, the combining ratio η(θ) in the RF combining circuit 5 takes the form shown in FIG. 5. Thus, the waveform of the radio-frequency voltage $v_{PX}$ outputted from the RF combining circuit 5 is sinusoidal, as shown in FIG. 16(*b*). Hence, the radio-frequency power $P_X$ outputted from the RF combining circuit 5 changes in a sinusoidal manner.

For changing the radio-frequency power $P_X$ so as to take a desired waveform, the phase difference θ may be changed so that the radio-frequency voltage $v_{PX}$ has a desired waveform. Since the combining ratio $\eta(\theta)=\cos^2(\theta/2)$, the phase difference θ with respect to the combining ratio η is expressed by the following equation (11).

$$\theta = 2\cdot\cos^{-1}(\sqrt{\eta}) \tag{11}$$

For example, when the radio-frequency voltage $v_{PX}$ is to take the waveform (triangular waveform) shown in FIG. 16(*c*), the phase difference θ is caused to vary with time t so that the combining ratio η corresponds to the waveform shown in FIG. 16(*c*). To this end, in equation (11), the combining ratio η is substituted by the function x(t) representing the waveform of FIG. 16(*c*). In this manner, a desired combining ratio η can be set. For example, as in the waveform of FIG. 16(*d*), a triangular waveform and a constant-level waveform may be combined. As in the waveform shown in FIG. 16(*e*), a sinusoidal waveform and a constant-level waveform may be combined.

FIG. 16(*b*)-16(*e*), the combining ratio η(θ) in the RF combining circuit 5 may become zero at a time and therefore the output may be zero. When such zero output is not desired, the calculation formula of the phase difference θ may be adjusted so that the phase difference θ does not become 180 [deg].

As an example of the waveform of the radio-frequency voltage $v_{PX}$, the waveform shown in FIG. 9 may be modified to obtain a waveform (see FIG. 16(*f*)) in which overshooting is implemented at the time of plasma ignition. To this end, in repeating a set of two periods, i.e., the first period t1 in which the phase difference θ is set to the first phase difference θ1 (for example 20 [deg]) and the second period t2 in which the second phase difference θ2 (for example 160 [deg]), a third period t3 for overshoot may be provided before the first period t1 at the time of plasma ignition. In such third period t3, the phase difference θ may be given by the following equation (12), where T is the length of the third period t3. In this manner, at the time of plasma ignition (at the start of the third period t3: t=0), the combining ratio η becomes maximum with the phase difference θ being 0. During the third period t3, the phase difference θ increases, while the combining ratio η decreases with time. At the end of the third period t3 (t=T), the phase difference θ becomes θ1. Note that the phase difference θ may be set to "0" at any time during the third period t3. By setting the radio-frequency voltage $v_{PX}$ to the waveform including overshooting shown in FIG. 16(*f*), the radio-frequency voltage $v_{out}$ outputted to the load becomes high when the plasma is not ignited. Hence, the ignitability of plasma can be improved.

$$\theta = (\theta 1/T)\cdot t \tag{12}$$

It should be noted that the waveforms shown in FIG. 16 and the above calculation formulas including equation (12) are presented as mere examples. By appropriately setting the phase difference θ, the waveform of the radio-frequency voltage $v_{PX}$ outputted from the RF combining circuit 5 can have various waveforms, and the waveform of the radio-frequency power PX outputted from the RF combining circuit 5 can have a desired waveform.

The radio-frequency power source according to the present invention is not limited to the above-described embodiments. The specific configuration of each part of the radio-frequency power source of the invention may be varied in many ways.

LIST OF REFERENCE CHARACTERS

1: Radio-frequency power source
2: AC-DC converting circuit
3: DC-DC converting circuit
4, 4', 4": DC-RF converting circuit (radio-frequency generator)
4A: First DC-RF converting circuit (radio-frequency generator)
4B: Second DC-RF converting circuit (radio-frequency generator)
4C: Third DC-RF converting circuit (radio-frequency generator)
4D: Fourth DC-RF converting circuit (radio-frequency generator)
401: Low pass filter
5, 5', 5": RF combining circuit (radio-frequency combiner)
5A: First RF combining circuit (radio-frequency combiner)
5B: Second RF combining circuit (radio-frequency combiner)
5C: Third RF combining circuit (radio-frequency combiner)
6: Filtering circuit
7: PWM signal generating circuit
8: Radio-frequency signal generating circuit (radio-frequency generator)
8*a*: First radio-frequency generating circuit
8*b*: Second radio-frequency generating circuit 9: Controlling circuit (output controller)
10: Power detecting circuit
11: Plasma processing apparatus
12: Impedance matching device
U, U', U": Radio-frequency generating circuitry

The invention claimed is:

1. A radio-frequency power source comprising:
a radio-frequency signal generator that produces radio-frequency signals having a variable phase difference between them;
at least two amplifiers configured to amplify the radio-frequency signals, respectively;
a voltage supplier configured to supply DC voltage to the at least two amplifiers;
a radio-frequency combiner that combines amplified radio-frequency signals outputted from the at least two amplifiers by a predetermined ratio depending on the phase difference, and that outputs to a load;
an output controller that causes the radio-frequency signal generator to change the phase difference, thereby controlling radio-frequency power outputted from the radio-frequency combiner,
wherein the output controller performs control so that the phase difference changes so as to make the radio-frequency power outputted from the radio-frequency combiner into a desired waveform, while causing the radio-frequency signal generator to continue producing the radio-frequency signals when the DC voltage supplied from the voltage supplier remains constant.

2. The radio-frequency power source according to claim 1, wherein the output controller performs control so that the phase difference is switched between a first predetermined value and a second predetermined value.

3. The radio-frequency power source according to claim 2, wherein the predetermined ratio is greater when the phase difference is equal to the first predetermined value than when the phase difference is equal to the second predetermined value.

4. The radio-frequency power source according to claim 3, wherein the first predetermined value is equal to or greater than 0 (deg) and smaller than 90 (deg), and the second predetermined value is equal to or greater than 90 (deg) and equal to or smaller than 180 (deg).

5. The radio-frequency power source according to claim 4, wherein the first predetermined value is equal to 0 (deg).

6. The radio-frequency power source according to claim 4, wherein the second predetermined value is equal to 180 (deg).

7. The radio-frequency power source according to claim 1, further comprising a power detector configured to detect power outputted to the load, wherein the output controller performs feedback control by changing the phase difference so that the power detected by the power detector equals a target power.

8. The radio-frequency power source according to claim 2, wherein the radio-frequency signal generator generates a first radio-frequency signal and a second radio-frequency signal, and the output controller switches a phase difference of the second radio-frequency signal relative to the first radio-frequency signal between the first predetermined value and the second predetermined value.

9. The radio-frequency power source according to claim 1, wherein the output controller switches the phase difference among a first predetermined value, a second predetermined value and a third predetermined value.

10. The radio-frequency power source according to claim 1, wherein the output controller changes the phase difference in accordance with a linear function.

11. The radio-frequency power source according to claim 1, wherein the output controller switches the phase difference between a first predetermined value and a value of a predetermined function.

12. The radio-frequency power source according to claim 2, wherein the output controller sets the phase difference to a predetermined phase difference at a time when power output to the load starts, and wherein the power output becomes greater when the predetermined phase difference is set than when each of the first predetermined value and the second predetermined value is set.

13. The radio-frequency power source according to claim 1, wherein the output controller does not set the predetermined ratio to zero.

14. The radio-frequency power source according to claim 1, wherein the radio-frequency combiner is constituted by hybrid circuitry comprising a transmission transformer and a power-consuming resistor, and wherein when there is a phase difference between the plurality of radio-frequency signals, the resistor thermally consumes power corresponding to the phase difference, and remaining power is outputted from the radio-frequency combiner.

* * * * *